United States Patent [19]

Nakamura et al.

[11] Patent Number: 5,668,838
[45] Date of Patent: Sep. 16, 1997

[54] INSTANTANEOUS PHASE DETECTING CIRCUIT AND CLOCK RECOVERY SIGNAL GENERATING CIRCUIT INCORPORATED IN DIFFERENTIAL DEMODULATOR

[75] Inventors: Seizo Nakamura; Yuji Iguchi; Akinobu Kodama, all of Tokyo, Japan

[73] Assignee: OKI Electric Industry Co., Ltd., Tokyo, Japan

[21] Appl. No.: 621,646

[22] Filed: Mar. 26, 1996

Related U.S. Application Data

[62] Division of Ser. No. 307,632, Sep. 20, 1994, Pat. No. 5,537,442.

[30] Foreign Application Priority Data

Jan. 22, 1993 [JP] Japan ................... 5-008851

[51] Int. Cl.$^6$ ................. H03D 1/00; H04L 27/06
[52] U.S. Cl. .......................... 375/340; 375/330
[58] Field of Search ........................ 375/283, 340, 375/330, 375; 329/306, 346, 310

[56] References Cited

U.S. PATENT DOCUMENTS

| | | |
|---|---|---|
| 3,971,996 | 7/1976 | Motley et al. |
| 4,028,626 | 6/1977 | Motley et al. |
| 4,190,802 | 2/1980 | Levine |
| 4,569,061 | 2/1986 | Breitwisch ............... 375/336 |
| 4,714,892 | 12/1987 | Ishizuka ................. 375/330 |
| 4,746,872 | 5/1988 | Yamagata ................ 375/330 |
| 4,881,243 | 11/1989 | Whitt |
| 4,912,726 | 3/1990 | Iwamatsu et al. |
| 4,928,275 | 5/1990 | Moore et al. |

FOREIGN PATENT DOCUMENTS

| | | |
|---|---|---|
| 50-66105 | 6/1975 | Japan |
| 55-27799 | 2/1980 | Japan |
| 61-265 922 | 11/1986 | Japan |
| 1-382 44 | 8/1989 | Japan |

OTHER PUBLICATIONS

Yoshikiko Akaiwa et al., "A Linea Modulation Scheme for Digital Mobile Radio Communications", 1985 *IEEE*, pp. 965–969.

Hiroshi Nobuta et al., "π / 4–shift QPSK Differential Demodulator for Digital Cordless Telephone". 1992 *Spring Meeting of Electronic Data Communication Society* (with an English translation.

*Primary Examiner*—Stephen Chin
*Assistant Examiner*—Betsy L. Deppe
*Attorney, Agent, or Firm*—Spencer & Frank

[57] ABSTRACT

An instantaneous phase detecting circuit for detecting the phase of a digital phase modulation wave signal which includes first and second logic circuits, first and second phase detecting circuits, and a third logic circuit. The first and second logic circuits receive the modulation wave signal, the first logic circuit receives a first carrier signal, and the second logic circuit receives a second carrier signal, the phase of the second carrier signal being delayed by a fixed period with respect to the phase of the first carrier signal. The first and second logic circuits generate first and second arithmetic outputs which are received by the first and second phase detecting circuits which detect the phases of the first and second arithmetic outputs to generate first and second detection output signals respectively. The third logic circuit receiving the first and second detection output signals and compares a periodic deviation of the first and second detection output signals to detect the phase of the modulation wave signal.

5 Claims, 20 Drawing Sheets

FIG. 2

| OUTPUT FROM FIRST STAGE | OUTPUT FROM N'TH STAGE | UP-DOWN COUNTER |
|---|---|---|
| 0 | 0 | ............... |
| 0 | 1 | DOWN COUNT |
| 1 | 0 | UP COUNT |
| 1 | 1 | ............... |

FIG. 5

| PREAMBLE | UW | DATA PROPER |

FIG. 6a

| DETECTION NO. | CONDITIONS OF DETECTION | TIMING ADJUSTING OUTPUT |
|---|---|---|
| 1 | CROSS AT LEVEL 0 DETECTED AND CROSS AT LEVEL 1 DETECTED WITHIN FIXED INTERVAL (Td) | LEVEL 0 CROSS TIMING + t0 + T/2 |
| 2 | CROSS AT LEVEL 1 DETECTED AND CROSS AT LEVEL 0 DETECTED WITHIN FIXED INTERVAL (Td) | LEVEL 1 CROSS TIMING + t0 + T/2 |
| 3 | CROSS AT LEVEL 1 DETECTED AND CROSS AT LEVEL 0 NOT DETECTED WITHIN FIXED INTERVAL (Td) | LEVEL 1 CROSS TIMING + T/2 |

FIG. 6b

| DETECTION NO. | CONDITIONS OF DETECTION | TIMING ADJUSTING OUTPUT |
|---|---|---|
| 1 | CROSS AT LEVEL 0 DETECTED AND CROSS AT LEVEL 1 DETECTED WITHIN FIXED INTERVAL (Td) | LEVEL 0 CROSS TIMING + t0 + T/2 |
| 2 | CROSS AT LEVEL 2 DETECTED AND CROSS AT LEVEL 0 DETECTED WITHIN FIXED INTERVAL (Td) | LEVEL 1 CROSS TIMING + t0 + T/2 |
| 3 | CASE OF SATISFYING CONDITIONS OTHER THAN THOSE SHOWN ABOVE | LEVEL 1 CROSS TIMING + T/2 |

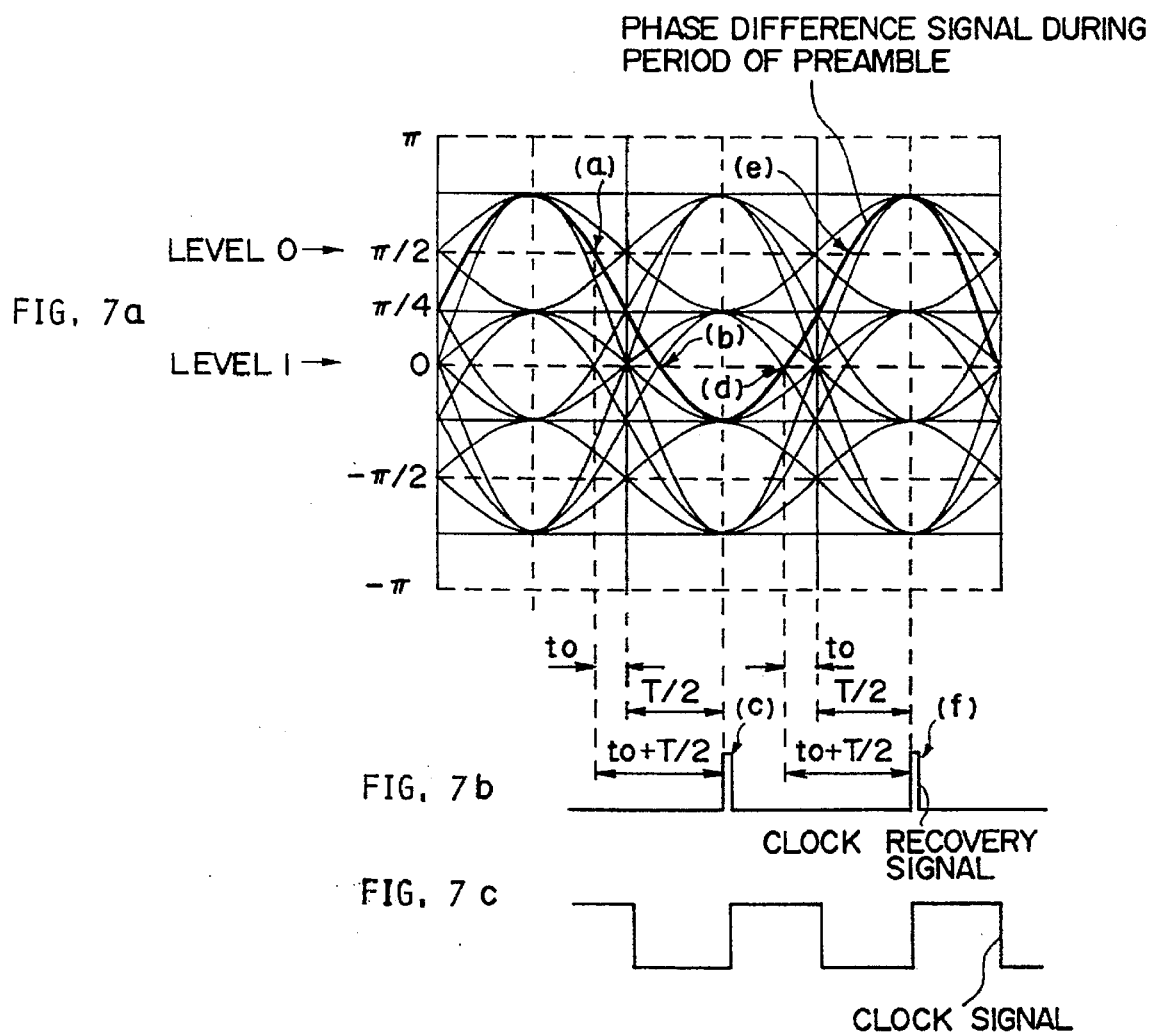

PHASE DIFFERENCE SIGNAL DURING PERIOD OF PREAMBLE

PHASE DIFFERENCE SIGNAL DURING PERIOD OF PREAMBLE

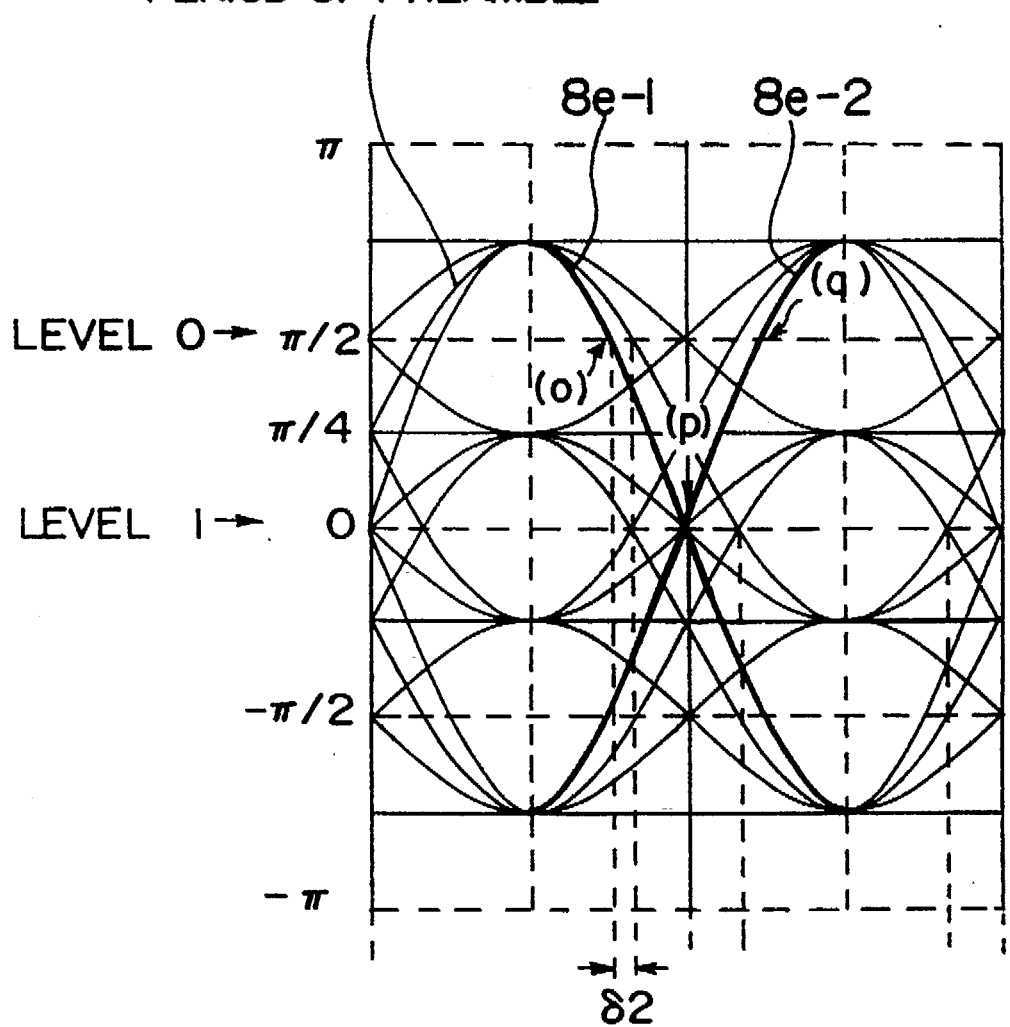

F I G. 1 0

| | DETECTION NO. | CONDITIONS OF DETECTION | TIMING ADJUSTING OUTPUT |
|---|---|---|---|
| HIGH-SPEED CONTROL | 1 | CROSS AT LEVEL 0 DETECTED AND CROSS AT LEVEL 1 DETECTED WITHIN FIXED INTERVAL (Td) | LEVEL 0 CROSS TIMING + t0 + T/2 |
| | 2 | CROSS AT LEVEL 1 DETECTED AND CROSS AT LEVEL 0 DETECTED WITHIN FIXED INTERVAL (Td) | LEVEL 1 CROSS TIMING + t0 + T/2 |
| | 3 | CROSS AT LEVEL 1 DETECTED AND CROSS AT LEVEL 0 NOT DETECTED WITHIN FIXED INTERVAL (Td) | LEVEL 1 CROSS TIMING + T/2 |
| LOW-SPEED CONTROL | 4 | CROSS AT LEVEL 1 DETECTED | LEVEL 1 CROSS TIMING + T/2 |

FIG. 11

FIG. 19 PRIOR ART
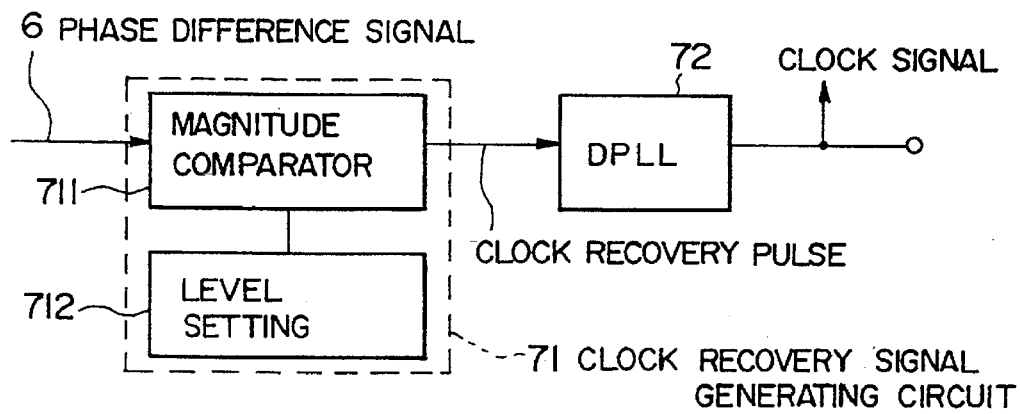
FIG. 20 a
FIG. 20 b
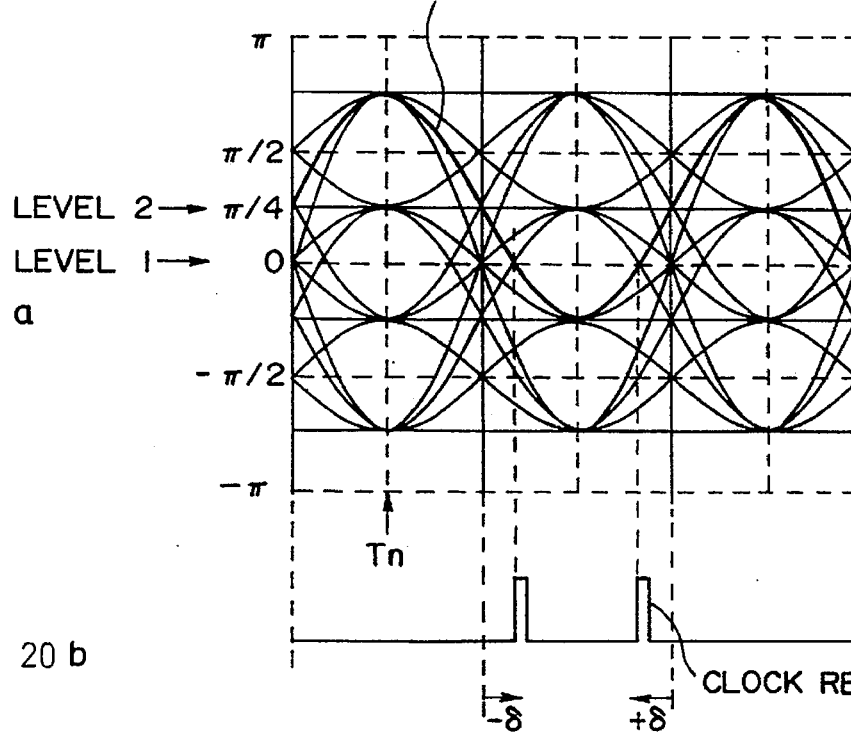

INSTANTANEOUS PHASE DETECTING CIRCUIT AND CLOCK RECOVERY SIGNAL GENERATING CIRCUIT INCORPORATED IN DIFFERENTIAL DEMODULATOR

This application is a division of application Ser. No. 08/307,632 filed Sep. 20, 1994, now U.S. Pat. No. 5,537,442 issued Jul 16, 1996.

TECHNICAL FIELD

This invention relates to an instantaneous phase detecting circuit and a clock recovery signal generating circuit which are incorporated in a differential demodulator for π/4-shift QPSK signals.

BACKGROUND ART

As means of digital modulation for the digital mobile communication, the π/4-shift QPSK method which carries out the modulation while shifting the phase axis by π/4at a time for each symbol period (two bits,for example) which forms one data unit has been adopted on account of various advantages attendant thereon, as discussed in "Proposal of Linear Modulation Method for Digital Mobile Communication," No. 2348, written jointly by Yoshihiko Akaiwa and Yoshiki Nagata and presented at the 1985 Consolidated National Meeting of Electronic Communication Society (Literature 1). The differential demodulator of the π/4-shift QPSK method which realizes miniaturization of the structure of modulation and economization of the power consumption has been also proposed in "Proposal of Linear Modulation Method for Digital Mobile Communication," No. 2348, written jointly by Yoshihiko Akaiwa and Yoshiki Nagata and presented at the 1985 Consolidated National Meeting of Electronic Communication Society "λ/4-Shift QPSK Differential Demodulator for Digital Cordless Telephone," No. B-344, written Jointly by Hiroshi Shida, Tsutomu Suda, and Kenzo Urabe and presented at the 1992 Spring General Meeting of Electronic Data Communication Society (Literature 2).

FIG. 16 represents a block diagram of the conventional differential demodulator which is disclosed in literature 2.

Now, the differential demodulator for the modulation of a π/4-shift QPSK signal will be described below with reference to FIG. 16.

The differential demodulator comprises an input terminal 1, an oscillator 2, an instantaneous phase detecting circuit 3, a phase difference computing circuit 5, a clock recovery circuit 7, a data regenerating circuit 8, a clock recovery signal output terminal 9, and a regenerating data output terminal 10.

The input terminal 1 admits a modulation wave (carrier wave) signal (10 or 7 MHz, for example) which has been modulated by the π/4-shift QPSK method.

The oscillator 2 generates an electric oscillation which is asynchronous with and substantially equal in frequency to the modulated signal introduced to the input terminal 1.

FIG. 17 represents. a block diagram of the conventional instantaneous phase detecting circuit 3. The instantaneous phase detecting circuit 3 is composed of an exclusive OR (hereinafter "EX-OR") circuit 171, a D type flip-flop (hereinafter "DFF") circuit 172, an analog low-pass filter (hereinafter "LPF") 173, an analog/digital converter (hereinafter "A/D converter") 174, and a polarity switching circuit 175.

Now, the operation of the instantaneous phase detecting circuit 3 will be described below with reference to FIG. 18.

FIG. 18a represents phase detection characteristics which have been processed by the EX-OR circuit 171 and the LPF 173. In the diagram, the periods of 0–π, 2π–3π, and 4π–5π have an upwardly slanting phase detection characteristic and the periods of π–2π, 3π–4π, and 5π–6π have a downwardly slanting phase detection characteristic respectively to the right. FIG. 18b represents the phase detection characteristics of the DFF circuit 172. In the diagram, the periods of 0–π, 2π–3π, and 4π–5π have a phase detection characteristic of 1 and the periods of π–2π, 3π–4π, and 5π–6π have a phase detection characteristic of 0.

The output shown in FIG. 18a is emitted as it is when the output from the DFF circuit 172 is 1. The output shown in FIG. 18a is emitted with the sign thereof inverted when the output from the DFF circuit 172 is 0. As a result, a linear phase detection is effected over the periods of from π to 3π and 3πto 5π as shown in FIG. 18c.

The clock recovery circuit 7 is composed of a clock recovery signal generating circuit 71 and a digital phase locked loop (hereinafter "DPLL") 72 as shown in FIG. 19. The clock recovery signal generating circuit 71 is composed of a magnitude comparator 711 and a level setting circuit 712.

FIG. 20a represents the relation between the conventional clock recovery signal and the eye pattern. The term "eye pattern" refers to a figure derived from the loci of a phase difference signal 6 which are described by all the patterns possibly assumed by the phase difference signal 6. The expression "the eye pattern is opened" as used herein refers to the state in which figures enclosed with one phase difference signal 6 and another phase difference signal 6 assume the shape of a human eye. The expression "the eye pattern is closed" refers to the state in which figures enclosed with such phase difference signals 6 assume a decreased area.

The conventional instantaneous phase detecting circuit 3, however, relies for phase discrimination on the DFF circuit 172. The phase discrimination by the DFF circuit 172 lasts only during the instant of initiation of the signal admitted into the clock terminal. When the input modulation wave has a low frequency, namely when the frequency of the oscillator 2 is low (as, for example, when a frequency of 1.2 MHz is used), therefore, the intervals of polarity discrimination are too wide to coincide with the phase discrimination of FIG. 18a. The phase discrimination in this case, therefore, is at a disadvantage in breaking the continuity of the phase detection in the neighborhood of π, 2π, . . . , nπ (n for an integer).

Further, the conventional clock recovery signal generating circuit 71 entails jitters ±δ as shown in FIG. 20b. Therefore, it has the problem of developing a deadlock and consequently failing to effect a recovery satisfactorily when the recovered clock signal by the DPLL 72 has a difference of 180° from the phase of the phase difference signal 6. The term "jitters" as used herein refers to fluctuations of the phase difference signal 6 relative to the clock signal.

With reference to the diagram of FIG. 20a, the Jitters are substantially effaced by setting the detection level during the period of preamble at level 2 (phase difference of π/4) and returning the detection level to level 1 (phase difference of 0) after termination of the period of preamble. This method, however, entails the necessity of discerning whether the data currently received are those of preamble, those of UW, or those of data proper. The discrimination of sorts of data proves appreciably difficult and requires use of such an external circuit as a microprocessor and can never be realized by a simple circuit configuration. The external microprocessor is so busy in realizing other functions of processing that it cannot be easily utilized for discriminating between sorts of data. As a result, it is difficult to adopt the method which resorts to switching the set levels depending on the sorts of data mentioned above.

It is an object of this invention to provide an instantaneous phase detecting circuit which precludes discontinuation of phase and gives rise to no inconvenience in response to a decrease in the frequency of the input modulation wave. It is another object of this invention to provide an instantaneous phase detecting circuit which is composed of invariably digital circuits and has no use for the analog LPF 173 and the A/D converter 174 which have been heretofore found as indispensable components.

It is a further object of this invention to provide a clock recovery signal generating circuit which generates such a clock recovery signal as is capable of ideally effecting recovery at the time that the DPLL leads in a clock signal or even after it has led in the clock signal.

SUMMARY OF THE INVENTION

First, the instantaneous phase detecting circuit of this invention is characterized by comprising a first logic arithmetic circuit for admitting a modulation wave signal and a carrier, performing a logical operation using the two input signals, and emitting a first result of arithmetic operation, a second logic arithmetic circuit for admitting the modulation wave signal and a signal having the phase of the carrier delayed by a fixed period, performing a logical operation using the two input signals, and emitting a second result of the arithmetic operation, a first phase detecting circuit for admitting the first result of the arithmetic operation and the carrier, detecting the phase of the first result of the arithmetic operation, and emitting a first result of detection, a second phase detecting circuit for admitting the second result of the arithmetic operation and the carrier, detecting the phase of the second result of the arithmetic operation, and emitting a second result of detection, and a third logic arithmetic circuit for admitting the first and the second result of detection and comparing the two input signals by the use of the deviation of period between the two input signals thereby detecting the phase of the modulation wave signal.

The clock recovery signal generating circuit of this invention for the generation of a clock recovery signal is characterized by comprising a plurality of detection axis cross detecting means having detection axes varied in magnitude and severally serving to admit a phase difference signal and detect the time at which the phase difference signal crosses the detection axis of a prescribed magnitude, locus sorting means for discriminating and sorting the locus of a change in the phase difference signal based on the data of timing obtained by the detection axis cross detecting means and emitting a timing adjusting signal in conformity with the result of the sortation, and timing control means for generating a clock regenerating signal by correcting the detection timing obtained by one of the plurality of detection axis cross detecting means designated by the timing adjusting signal with the time designated by the timing adjusting signal.

The clock recovery signal generating circuits according to the present invention are constructed as follows.

Specifically, they each comprise a plurality of detection axis cross detecting means having detection axes varied in magnitude and serving to detect the time at which the phase difference signal crosses the detection axis of a prescribed magnitude, a locus sorting means for discriminating and sorting the locus of a change in the phase difference signal based on the data on detection timing obtained by the detection axis cross detecting means and emitting a timing adjusting signal in conformity with the result of the sorting operation, and a timing control means for correcting the detection timing obtained by one of the plurality of detection axis cross detecting means designated by the timing adjusting signal with the time designated by the timing adjusting signal and using the result of the correction as a phase signal for clock recovery.

It is desirable that the construction described above is further provided with phase difference discriminating means capable of detecting the fact that the difference between the phase of the recovered clock signal and the phase of the clock recovery phase signal has fallen below a prescribed magnitude and, at the same time, the locus sorting means is so adapted as to effect the relevant processing exclusively by the use of the detection timing obtained by one of the plurality of detection axis cross detecting means when the phase discriminating means has performed an action of detection.

In the clock recovery signal generating circuit of this invention, the plurality of detection axis cross detecting means severally detect the times at which the phase difference signal admitted in the circuit crosses the detection axes of magnitudes prescribed severally therefor and inform the locus sorting means of the detected times. The locus sorting means discriminates and sorts the locus of a change in the phase difference signal based on the times detected by the detection axis cross detecting means and issues a timing adjusting signal in conformity with the result of the sorting operation to the timing control means. The timing control means corrects the detection timing obtained by one of the detection axis cross detecting means designated by the timing adjusting signal with the time designated by the timing adjusting signal and delivers the result of the correction as a phase signal for clock regeneration to the DPPL.

In such a communication system as is adapted to operate by the transmission of a fixed pattern for clock recovery, for example, the timing control circuit is enabled by the adjustment with the timing adjusting signal to emit a phase signal for clock recovery during the period of the fixed pattern when the locus sorting means is caused in advance to learn how to discriminate the period of this fixed pattern from any other period. Even during any other period than the period of the fixed pattern, the phase signal for clock recovery free from jitter can be emitted with high probability, depending on the setting of the locus sorting. As a result, the phase of the clock signal to be emitted from the DPLL gains in desirability and stability.

Here, phase difference discriminating means capable of detecting the fact that the difference between the phase of the recovered clock signal and the phase of the clock recovery phase signal has fallen below a prescribed magnitude is provided additionally and the locus sorting means is so adapted as to effect the relevant processing by exclusively using the detection timing obtained by one of the plurality of detection axis cross detecting means when the phase difference discriminating means has performed an action of detection. As a result, the phase of the clock signal can be quickly incorporated into the phase of the phase difference signal and, at the same time, the stabilization of the clock signal thus incorporated is realized with exalted infallibility.

BRIEF DESCRIPTION OF THE DRAWINGS

FIG. 2 is a table showing an arithmetic operation pattern of a comparison circuit of the present invention.

FIG. 5 is a diagram showing the data to be used in the present invention.

FIG. 6 is a diagram showing the conditions of detection and the timing adjusting outputs.

FIGS. 7a, 7b, and 7c are diagrams showing the locus pattern of a phase difference signal, the output timing adjustment of a clock recovery pulse and the output timing respectively.

FIG. 8e is a diagram showing the locus pattern of a phase difference signal.

FIG. 10 is a diagram showing the conditions of detection and the timing adjusting output.

FIG. 11 is a block diagram illustrating a third example of the clock recovery signal generating circuit of the present invention.

FIG. 19 is a diagram showing a conventional clock recovery circuit.

FIGS. 20a and 20b are diagrams showing the locus pattern of a phase difference signal and the output timing of a conventional clock recovery signal respectively.

BEST MODE OF EMBODYING THE INVENTION

First, an example of the instantaneous phase detecting circuit of the present invention will be explained in detail below with reference to the accompanying drawings.

Figure 1:
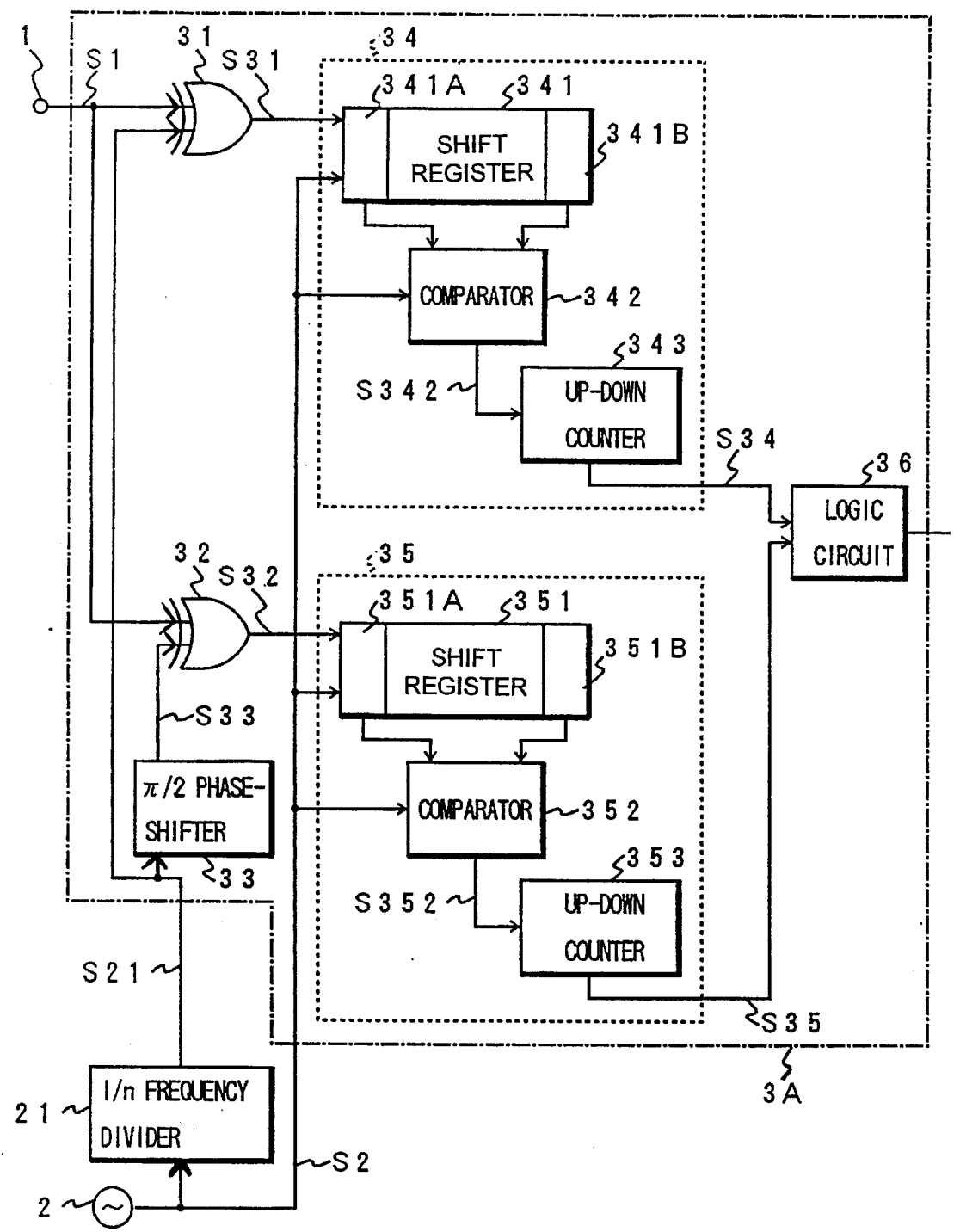
FIG. 1 is a block diagram illustrating an example of the instantaneous phase detecting circuit of the present invention.

FIG. 1 is a block diagram illustrating in detail the construction of an instantaneous phase detecting circuit 3A of the present invention. The instantaneous phase detecting circuit 3A is composed of a 1/n frequency divider 21, EX-OR circuits 31 and 32, a $\pi/2$ phase-shifter 33, motion averaging filters 34 and 35, and a logic circuit 36.

The motion averaging filter 34 is composed of an N-stage shift register 341, a comparator 342, and an up-down counter 343.

Similarly, the motion averaging filter 35 is composed of an N-stage shift register 351, a comparator 352, and an up-down counter 353.

To the 1/n frequency divider 21 is applied a carrier S2 generated from an oscillator 2. The 1/n frequency divider 21 serves to divide the carrier S2 into 1/n frequency. Here, the 1/n frequency is substantially equal to the frequency of a modulation wave signal S1 applied through an input terminal 1. Then, the 1/n frequency divider 21 issues a signal S21 divided into the 1/n frequency to the EX-OR circuit 31 and the $\pi/2$ phase-shifter 33.

To the $\pi/2$ phase-shifter 33 is applied the signal S21 divided into the 1/n frequency. The $\pi/2$ phase-shifter 33 shifts the phase of the received signal S21 with a delay of $\pi/2$. Then, the $\pi/2$ phase-shifter 33 generates a signal S33 having a phase delayed by $\pi/2$ to the EX-OR circuit 32.

The EX-OR circuits 31 and 32 are severally composed of electric circuits, semiconductor elements, etc.

To the EX-OR circuit 31 are applied a modulation wave signal S1 and the signal S21 divided into the 1/n frequency. Then, the EX-OR circuit 31 carries out an exclusive logical sum operation on the input modulation wave signal S1 and the signal S21 divided into the 1/n frequency. The EX-OR circuit 31 subsequently issues the result of the exclusive logical sum operation as a signal S31 to the motion averaging filter 34.

To the EX-OR circuit 32 are injected the modulation wave signal S1 and the signal S33 having a phase delayed by $\pi/2$. Then, the EX-OR circuit 32 carries out an exclusive logical sum operation on the input modulation wave signal S1 and the signal S33 having a phase delayed by $\pi/2$. The EX-OR circuit 32 subsequently issues the result of the exclusive logical sum operation as a signal S32 to the motion averaging filter 35.

The motion averaging filter 34 is composed of the N-stage shift register 341, the comparator 342, and the up-down counter 343. Here, N stands for a natural number.

To the N-stage shift register 341 are applied the result of arithmetic operation S31 and the carrier S2. Here, the carrier S2 is used as a master clock for driving the motion averaging filter 34. Then, the N-stage shift register 341 issues the contents of a first stage 341A and those of an N'th stage 341B to the comparator 342. This issuance of the contents to the comparator 342 is carried out in accordance with the timing of the carrier S2 as the master clock.

To the comparator 342 are applied the carrier S2 and the contents of the first stage 341A of the N-stage shift register 341 and those of the N'th stage 341B. Here again, the carrier S2 is utilized as a master clock. After the arithmetic operations mentioned above have been completed, the comparator 342 issues the result of the arithmetic operations as a signal S342 to the up-down counter 343.

The arithmetical operation which is performed by the comparator 342 will be explained below. The arithmetical processing so fulfilled by the comparator 342 is broadly divided into the following three types (FIG. 2).

(1) The comparator 342 causes a +1 up count in the up-down counter 343 when the first stage 341A of the N-stage shift register 341 has an input of 1 and the N'th stage 341B thereof has a content of 0.

(2) The comparator 342 causes a −1 down count in the up-down counter 343 when the first stage 341A of the N-stage shift register 341 has an input of 0 and the N'th stage 341B thereof has a content of 1.

(3) The comparator 342 causes no change in the up-down counter 343 when the content of the first stage 341A of the N-stage shift register 341 and that of the N'th stage 341B thereof are equal (namely when the first stage 341A has a content of 0 and the N'th stage 341B has a content of 0 or when the first stage 341A has a content of 1 and the N'th stage 341B has a content of 1).

When the comparator 342 has performed the arithmetical processing described above for one timing of the master clock, the number of "1's" existing in the second through N'th stages of the N-stage shift register 341 is displayed in the up-down counter 343. The content of the up-down counter 343, therefore, indicates the outcome of the processing performed on the output from the EX-OR circuit 31 by the motion averaging filter which functions to average the time constant, T=(N−1)/fc. In the formula, N stands for the number of stages in the shift register 341 and fc for the frequency of the oscillator 2.

The up-down counter 343 generates a phase detection characteristic (numerical value counted as instructed by the comparator 342) S34 as an output to the logic circuit 36.

Incidentally, one example of the motion averaging filter circuit 34 is disclosed in JP-B-01-38,244.

To the N-stage shift register 351 are applied the result of arithmetic operation S32 and the carrier S2. In this case, the carrier S2 is utilized as a master lock for driving the motion averaging filter circuit 35. Then, the N-stage shift register 351 issues the content of the first stage 351A and the content of the N'th stage 351B as outputs to the comparator 352. This issuance of the outputs to the comparator 352 is carried out in accordance with the timing of the carrier S2 as a master clock.

To the comparator 352 are applied the carrier S2 and the content of the first stage 351A and that of the N'th stage 351B of the N-stage shift register 351. Again in this case, the carrier S2 is utilized as a master clock. The comparator 352 issues the result of arithmetic operation S352 as an output to the up-down counter 353.

The operation of the comparator 352 is identical with that of the comparator 342.

The up-down counter 353 issues a phase detection characteristic (numerical value counted as instructed by the comparator 352) S35 as an output to the logic circuit 36.

To the logic circuit 36 are applied the phase detection characteristic S34 and the phase detection characteristic S35. In the logic circuit 36, the sign of the input phase detection characteristic S34 is reversed on the basis of the input phase detection characteristic S35. When the input phase detection characteristic S35 has a minus sign, for example, the logic circuit 36 reverses the sign of the input phase detection characteristic to minus and emits the outcome of the sign reversion as an output. When the input phase detection characteristic S35 has a plus sign, the logic circuit 36 generates the input phase detection characteristic S34 in its unaltered form as an output.

Now, the operation of the instantaneous phase detecting circuit of the present invention will be described below with reference to FIGS. 3a–3c.

Figure 3A:
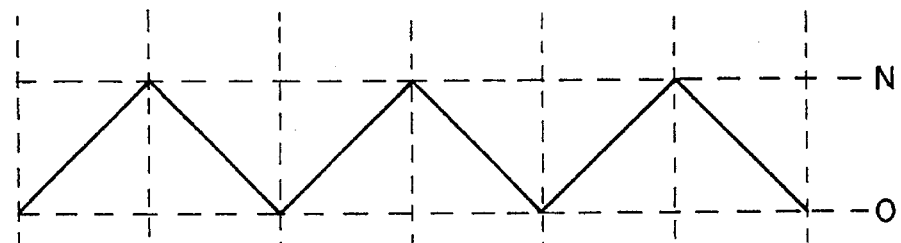
FIGS. 3a, 3b, and 3c are graphs showing a first and a second phase detection characteristic obtained by a motion averaging filter circuit and the result of a processing with the instantaneous phase detecting circuit of the present invention.

FIG. 3a is a graph showing the phase detection characteristic S34 which is obtained by the motion averaging filter 34. In FIG. 3a, the periods of $0-\pi$, $2\pi-3\pi$, and $4\pi-5\pi$ describe straight lines inclined upward to the right and indicating an increase of the content of the up-down counter 343 from 0 to N−1. The periods of $\pi-2\pi$, $3\pi-4\pi$, and $5\pi-6\pi$ describe straight lines inclined downward to the right and indicating a decrease of the content of the up-down counter 343 from N−1 to 0. In the graph, the horizontal axis is the scale of the phase difference between the signal S21 divided into the 1/n frequency and the modulation wave signal S1 and the vertical axis is the scale of the content of the up-down counter 343.

Figure 3B:
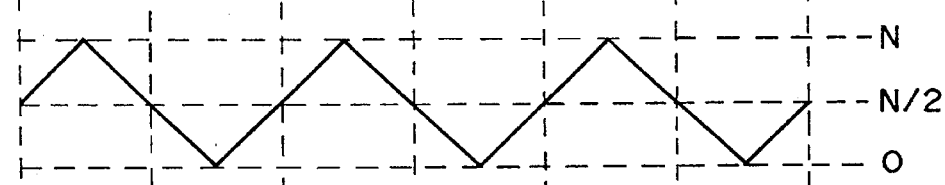

FIG. 3b is a graph showing the phase detection characteristic S35 which is obtained by the motion averaging filter 35. The phase detection characteristic S35 shown in FIG. 3b is delayed by a phase of $\pi/2$ from the phase detection characteristic S34 shown in FIG. 3a. This delay of phase is due to the $\pi/2$ phase-shifter 33.

In FIG. 3b, the period of $0-\pi/2$ describes a straight line inclined upward to the right and indicating an increase of the content of the up-down counter 353 from N/2 to N−1. The periods of $(3\pi/2)-(5\pi/2)$ and $(7\pi/2)-(9\pi/2)$ describe straight lines inclined upward to the right and indicating an increase of the content of the up-down counter 353 from 0 to N−1. The period of $(11\pi/2)-6\pi$ describes a straight line inclined upward to the right and indicating an increase of the content of the up-down counter 353 from 0 to N/2. Then, the periods of $\pi/2-(3\pi/2)$, $(5\pi/2)-(7\pi/2)$, and $(9\pi/2)-(11\pi/2)$ describe straight lines inclined downward to the right and indicating a decrease of the content of the up-down counter 353 from N−1 to 0. In the graph, the horizontal axis is the scale of the phase difference between the signal S21 divided into the 1/n frequency and the modulation wave signal S1 and the vertical axis is the scale of the content of the up-down counter 353.

The logic circuit 36 treats the periods of $0-\pi$, $2\pi-3\pi$, and $4\pi-5\pi$ as positive periods and the periods of $\pi-2\pi$, $3\pi-4\pi$, and $5\pi-6\pi$ as negative periods on the basis of N/2 in the content of the up-down counter 353.

In the periods discriminated as positive periods in FIG. 3b, the logic circuit 36 generates the phase detection characteristic S34 shown in FIG. 3a in its unaltered form as an output. Then, in the periods discriminated as negative periods in FIG. 3b, the logic circuit 36 emits the phase detection characteristic S34 shown in FIG. 3a with an inverted sign as an output.

Figure 3C:
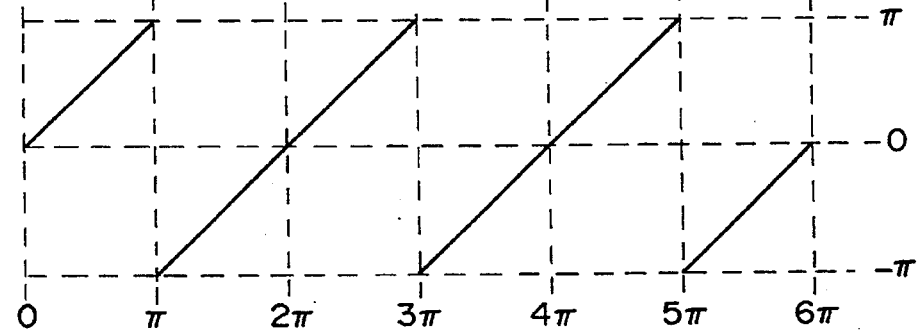

The graph shown in FIG. 3c is consequently obtained. In FIG. 3c, the period of $0-\pi$ describes a straight line inclined upward to the right and indicating an increase of the phase from 0 to $\pi$. The periods of $\pi-3\pi$ and $3\pi-5\pi$ describe straight lines inclined upward to the right and indicating an increase of the phase from $-\pi$ to $\pi$. Then, the period of $5\pi-6\pi$ describes a straight line inclined upward to the right and indicating an increase of the phase from $-\pi$ to 0.

In consequence of the operation described above, the instantaneous phase detecting circuit of the present invention processes the digital phase modulation wave by the use of the two EX-OR circuits, the motion averaging filter circuit, and the logic circuit so as to have one phase delayed by $\pi/2$ from the other phase. Owing to this processing, the instantaneous phase detecting circuit of this invention does not easily encounter discontinuation of phase detection even when the modulation wave to be received as an input has such a low frequency as 1 or 2 MHz. The instantaneous phase detecting circuit of this invention, therefore, is capable of effecting phase detection with accuracy.

This invention does not limit the delay of phase to $\pi/2$. It can be likewise embodied even when the delay is 0, $\pi/4$, etc., for example. When the delay is so changed, the construction of the logic circuit 36 may be suitably altered in conformity with the particular phase delay.

Since the instantaneous phase detecting circuit of this invention uses a motion averaging filter for its configuration as described above, it can be digitized, adapted for integration of the circuit, and allowed to enjoy a cut in cost. The devices which use the instantaneous phase detecting circuit of this invention, therefore, are at an advantage in attaining reduction in size and weight.

Figure 4:
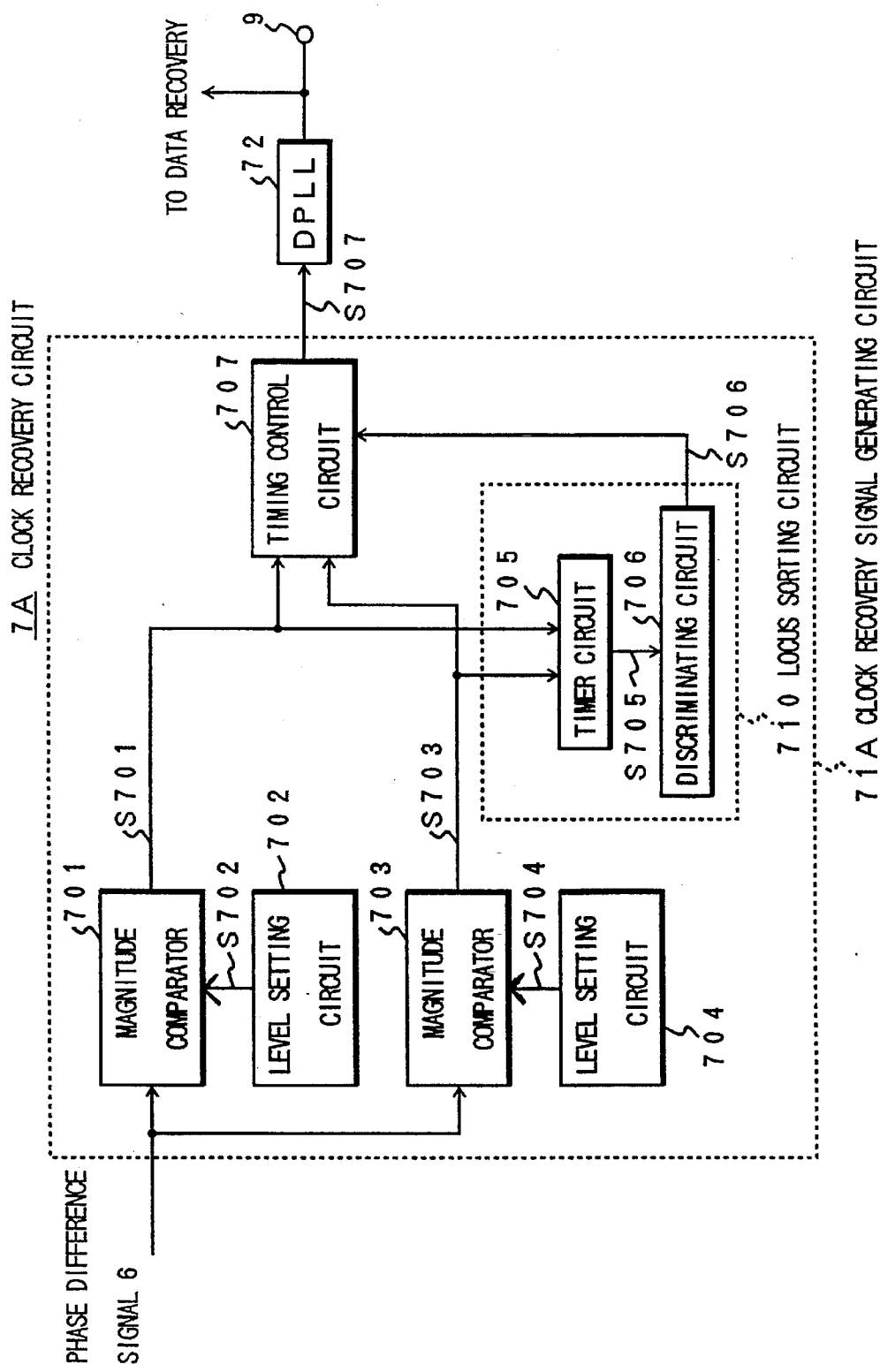
FIG. 4 is a block diagram illustrating a first example of the clock recovery signal generating circuit of the present invention.

Now, the first example of the clock recovery signal generating circuit of the present invention will be described below with reference to the annexed drawings. FIG. 4 is a block diagram illustrating in detail the construction of the first example.

A clock recovery circuit 7A is composed of a clock recovery signal generating circuit 71A and the DPLL (digital phase locked loop) circuit 72.

The clock recovery signal generating circuit 71A is composed of magnitude comparators 701 and 703, level setting circuits 702 and 704, a locus sorting circuit 710, and a timing control circuit 707. The locus sorting circuit 710 is composed of a timer circuit 705 and a discriminating circuit 706. Here, the magnitude comparator 701 and the level setting circuit 702 are disposed correspondingly. The magnitude comparator 703 and the level setting circuit 704 are also disposed correspondingly.

Now, the construction of the clock recovery signal generating circuit 71A will be described below, The magnitude comparators 701 and 703 are comparators of a sort for use with digital circuits. The magnitude comparators 701 and 703 are circuits for generating an instantaneous pulse when the phase difference signal 6 received as an input equals the magnitude of detection level (detection axis) set in advance by the corresponding level setting circuits 702 and 704.

The level setting circuit 702 and 704 set the magnitude of detection level (detection axis) and generate the magnitude of detection level as an output to the magnitude comparators 701 and 703.

To the magnitude comparator 701 are injected the phase difference signal 6 and a magnitude of detection level S702 issued from the level setting circuit 702. The magnitude comparator 701 compares the input phase difference signal 6 with an input magnitude of detection level S701 and determines whether or not they are equal. The magnitude comparator 701 generates the pulse S701 (hereinafter the pulse S701 issued from the magnitude comparator 701 will be referred to briefly as "level 1 cross pulse S701") only when it has discriminated the equality between the input phase difference signal 6 and the input magnitude of detection level S702. When the magnitude comparator 701 has issued the level 1 cross pulse S701, the magnitude comparator 701 generates the level 1 cross pulse S701 as an output to the timing control circuit 707 and the locus sorting circuit 710. Here, the level setting circuit 702 has level 1 corresponding to a phase difference of 0 set as the magnitude of detection level S702 (refer to FIG. 6a and FIGS. 7a, 7b and 7c which will be specifically described hereinafter).

Similarly to the magnitude comparator 703 are applied the phase difference signal 6 and a magnitude of detection level S704 to be issued from the level setting circuit 704. The magnitude comparator 703 determines whether or not the input phase difference signal 6 and the input magnitude of detection level S704 are equal. The magnitude comparator 703 issues a pulse S703 (hereinafter the pulse S703 issued by the magnitude comparator 703 will be referred to briefly as "level 0 cross pulse S703") only when it has discriminated the equality between the input phase difference signal 6 and the input magnitude of detection level S704. When the magnitude comparator 703 has issued the level 0 cross pulse S703, the magnitude comparator 703 issues the level 0 cross pulse S703 as an output to the timing control circuit 707 and the locus sorting circuit 710. Here, the level setting circuit 704 has a level 0 corresponding to the phase difference of $\pi/2$ set as the magnitude of detection level S704 (refer to FIG. 6a and FIGS. 7a, 7b and 7c which will be specifically described hereinbelow).

The locus sorting circuit 710 is composed of the timer circuit 705 and the discriminating circuit 706. The locus sorting circuit 710 discriminates and sorts the locus of a change in the phase difference signal 6 on the basis of the level 1 cross pulse S701 and the level 0 cross pulse S703. Then, the locus sorting circuit 710 generates a timing adjusting signal S706 corresponding to the discriminated sort as an output to the timing control circuit 707.

To the timer circuit 705 are applied the level 1 cross pulse S701 and the level 0 cross pulse S703. The timer circuit 705 starts the timer counting when it has received either of the level 1 cross pulse S701 and the level 0 cross pulse S703 as an input. Then, the timer circuit 705 causes the timer to cease the counting when either of the level 1 cross pulse S701 and the level 0 cross pulse S703 is introduced as an input within a fixed interval after the start of the timer counting. Here, one and the same pulse may be used for starting and terminating the timer counting. For example, the level 0 cross pulse S703 may be applied to start the timer counting and the level 0 cross pulse S703 may be also applied to terminate the timer counting. There are times when the pulse for terminating the timer counting is not applied within the fixed interval after the pulse for starting the timer counting has been injected. The timer circuit 705, therefore, is so constructed that the timer counting may be automatically terminated and reset after the elapse of the fixed interval. Then, the timer circuit 705 issues a count data (time counted) S705 as an output to the discriminating circuit 706 and resets the timer.

Here, the timer circuit 705 resets the timer with the level 0 cross pulse S701 and starts the clocking all over again from the beginning when the first pulse to be applied after the application of the level 0 cross pulse S701 happens to be the level 0 cross pulse S701.

The timer circuit 705 resets the timer with the level 1 cross pulse S703 and starts the clocking all over again from the beginning when the first pulse to be applied after the application of the level 1 cross pulse S703 happens to be the level 1 cross pulse S703.

To the discriminating circuit 706 is applied the count data S705. The discriminating circuit 706 determines whether or not the input count data S705 satisfies any of the conditions for detection stored in advance in the discriminating circuit 706 (refer to FIG. 6a which will be specifically described hereinbelow). Then, the discriminating circuit 706 generates as an output to the timing control circuit 707 the timing adjusting signal S706 which corresponds to the condition of detection found to be satisfied by the input count data S705.

To the timing control circuit 707 are applied the level 1 cross pulse S701, the level 0 cross pulse S703, and the timing adjusting signal S706. The timing control circuit 707 generates a clock recovery signal S707 as an output to the DPLL circuit 72 in accordance with the input timing adjusting signal S706 (refer to FIG. 6a which will be described specifically hereinbelow).

Now, the operations of the circuits within the clock recovery signal generating circuit 71A will be described and, through the description of these operations, the functions of the timer circuit 705, the discriminating circuit 706, and the timing control circuit 707 will be delineated.

In the first example, the two detection levels of level 0 and level 1 are set in the level setting circuit. The magnitude comparators severally issue a pulse at the moment that the phase difference signal 6 becomes equal to the magnitude of detection level. The locus sorting circuit 710 estimates what sort of a locus has been described by the phase difference signal 6 on the basis of the state of application of the pulse. In accordance with the estimated locus, the timing control circuit 707 selects the time preceding the generation of the clock recovery signal S707. The timing control circuit 707 effects the generation of the clock recovery signal S707 in accordance with the result of the selection. The first example operates by this method.

Here, the two magnitudes of detection level are the level 1 detection level S702 corresponding to the phase difference of 0 and the level 0 detection level S704 corresponding to the phase difference of $\pi/2$. The magnitude of detection level S702 is set in the level setting circuit 702 and the magnitude of detection level S704 in the level setting circuit 704.

To the magnitude comparator 701 are applied the phase difference signal 6 and the magnitude of detection level S702. The magnitude comparator 701 determines whether or not the phase difference signal 6 equals the detection level S702. When it has determined that the phase difference signal 6 and the magnitude of detection level S702 are equal, the magnitude comparator 701 generates the level 1 cross pulse S701. Then, the magnitude comparator 701 emits the level 1 cross pulse S701 so generated as an output to the timing control circuit 707 and the locus sorting circuit 710. When the magnitude comparator 701 has determined that the phase difference signal 6 and the magnitude of detection level S702 are not equal, it does not generate the level 1 cross pulse S701.

To the magnitude comparator 703 are applied the phase difference signal 6 and the detection level S704. The magnitude comparator 703 determines whether or not the phase difference signal 6 and the magnitude of detection level S704 are equal. When the magnitude comparator 703 has determined that the phase difference signal 6 and the magnitude of detection level S704 are equal, it generates the level 0 cross pulse S703. Then, the magnitude comparator 703 emits the level 0 cross pulse S703 so generated as an output to the timing control circuit 707 and the locus sorting circuit 710. When the magnitude comparator 703 has determined that the phase difference signal 6 and the magnitude of detection level S704 are not equal, it does not generate the level 0 cross pulse S703.

Now, the data to be used in the present invention will be described below with reference to FIG. 5.

The data is composed of a preamble part, a UW part, and a data proper.

The preamble part has the input of a preamble pattern. For example, it has the input of repetitions of "1001" in such a manner as "10011001 ... 1001."

The UW part has the input of a sign designating the head of a data.

The data proper has the input of a data which is desired to be transmitted.

FIG. 6a and FIG. 7 are diagrams showing the operations of the locus sorting circuit 710 and the timing control circuit 707 in the first example.

The time T denotes the duration of an operation equivalent to one symbol of data (time equal to 360°).

The fixed time Td denotes the duration of an operation for determining whether or not the phase difference signal 6 is a pulse in the period of preamble (time equal to 150°, for example).

The time t0 denotes the duration of an operation enabling the timing control circuit 707 to adjust the timing of emitting the clock recovery signal S707 (time equal to 60°, for example).

Now, the method for estimating the locus of the phase difference signal 6 will be described below with reference to FIG. 6a. FIG. 6a is a diagram showing the operations of the timer circuit 705 and the discriminating circuit 706 of the locus sorting circuit 710.

Detection No. 1 is obtained only when the conditions shown in 1 to 5 below are wholly satisfied sequentially in the order mentioned.

1. The timer circuit 705 admits the level 0 cross pulse S703 as an input.
2. The timer circuit 705 starts counting (clocking time).
3. The timer circuit 705 admits the level 1 cross pulse S701 as an input.
4. The timer circuit 705 terminates the counting (clocking of time).
5. The discriminating circuit 706 compares the count data (clock reading) S705 with the fixed time Td set in advance and finds that the count data is shorter than the fixed time Td.

When Detection No. 1 is obtained, the discriminating circuit 706 generates the timing adjusting signal S706 as an output to the timing control circuit 707. Then, after the elapse of the time |t0 +T/2| following the time of application of the level 0 cross pulse S703 into the locus sorting circuit 710, the timing adjusting signal S706 causes the timing control circuit 707 to issue the clock recovery signal S707 to the DPLL circuit 72.

Detection No. 2 is obtained only when the conditions shown in 1 to 5 below are wholly satisfied sequentially in the order mentioned.

1. The timer circuit 705 admits the level 1 cross pulse S701 as an input.
2. The timer circuit 705 starts counting (clocking time).
3. The timer circuit 705 admits the level 0 cross pulse S703 as an input.
4. The timer circuit 705 terminates the counting (clocking of time).
5. The discriminating circuit 706 compares the count data (clock reading) S705 with the fixed time Td set in advance and finds that the count data (clock reading) S705 is shorter than the fixed time Td.

When Detection No. 2 is obtained, the discriminating circuit 706 emits the timing adjusting signal S706 as an output to the timing control circuit 707. Then, after the elapse of the time |t0 +T/2| following the time of injection of the level 1 cross pulse S703 into the locus sorting circuit 710, the timing adjusting signal S706 causes the timing control circuit 707 to issue the clock recovery signal S707 to the DPLL circuit 72.

Detection No. 3 is obtained only when the conditions shown in 1 to 3 below are wholly satisfied sequentially in the order mentioned.

1. The timer circuit 705 admits the level 1 cross pulse S701 as an input.
2. The timer circuit 705 starts counting (clocking time).
3. The timer circuit 705 does not admit the level 0 cross pulse S703 within the fixed time Td.

When Detection No. 3 is obtained, the discriminating circuit 706 generates the timing adjusting signal S706 as an output to the timing control circuit 707. Then, after the elapse of the time |T/2| following the time of injection of the level 1 cross pulse S703 into the locus sorting circuit 710, the timing adjusting signal S706 causes the timing control circuit 707 to issue the clock recovery signal S707 to the DPLL circuit 72.

FIGS. 7a, 7b and 7c are explanatory diagrams showing sorting of the loci of the phase difference signal (detection of locus) and an explanatory diagram of the adjustment of the output timing of the clock regenerating pulse shown in FIG. 5.

The bold line in FIG. 7a represents the same locus "10011001 ... 1001" of the phase difference signal 6 during the period of preamble as shown in FIG. 20a. In the case of the π/4-shift QPSK signal, it is not the magnitude of phase difference itself of the phase difference signal 6 but the locus of the phase difference signal 6 that represents data value.

Here, π, π/2, π/4, 0, −π/2, and −π in the vertical axis of the graph denote magnitudes of phase difference. in FIG. 7a, the times a and e represent intersections of the phase difference signal 6 and the phase difference π/2 during the period of preamble. The times b and d represent intersections of the phase difference signal 6 and the phase difference 0 during the period of preamble.

First, the case in which Detection No. 1 is obtained will be described below with reference to FIG. 7a.

The phase difference signal 6 crosses the detection level magnitude at the time a during the period of preamble. Then, the timer circuit 705 of the locus sorting circuit 710 admits the level 0 cross pulse S703 as an input from the magnitude comparator 703 and starts counting. Then, the phase difference signal 6 during the period of preamble crosses the detection level magnitude at the time b. The timer circuit 705 consequently admits the level 1 cross pulse S701 as an input from the magnitude comparator 701 within the fixed time Td from the time point a and terminates the counting (at the time point b). Here, the discriminating circuit 705 determines that the count data S705 is shorter than the fixed time Td. Detection No. 1 is obtained in consequence of the operation described above.

At the time c which terminates the duration of |t0 +T/2| starting from the time a, the discriminating circuit 706 generates as an output to the timing control circuit 707 the timing adjusting signal S706 instructing the clock recovery signal S707 as an output to the DPLL circuit 72 (refer to FIG. 7b).

Then, the case in which Detection No. 2 is obtained will be described below with reference to FIG. 7a.

The phase difference signal 6 during the period of preamble crosses the detection level magnitude at the time d. As a result, the timer circuit 705 of the locus sorting circuit 710 admits the level 1 cross pulse S701 as an input from the magnitude comparator 701 and starts counting. Then, the phase difference signal 6 during the period of preamble crosses the detection level magnitude at the time e. As a result, the timer circuit 705 admits the level 0 cross pulse S703 as an input from the magnitude comparator 703 within the fixed time Td from the time d and terminates the counting (at the time e). Here, the discriminating circuit 705 determines that the count data S705 is shorter than the fixed time Td. Detection No. 2 is obtained in consequence of the operation described above.

At the time point f which terminates the duration of |t0 +T/2| starting from the time d, the discriminating circuit 706 generates as an output to the timing control circuit 707 the timing adjusting signal S706 instructing the clock recovery signal S707 as an output to the DPLL circuit 72 (refer to FIG. 7b).

Similarly thence, the phase difference signal 6 during the period of preamble adapts the locus sorting carrier 710 for the adjustment of timing of Detection No. 1 and Detection No. 2. Then, from the timing control circuit 707, the clock recovery signal S707 is emitted at such a timing that the eye pattern may be opened to the widest extent as illustrated in FIG. 7b (at the time points of c and f). As a result, a clock signal of a correct phase synchronized with this pulse is generated from the DPLL 72 as shown in FIG. 7c.

Here, the jitter δ is set at 0 as shown in FIG. 20b. Then, the clock recovery signal of FIG. 7b is compared with the clock recovery signal of FIG. 20b. It is consequently found that during the period of preamble, the phase of the clock recovery signal S707 given to the DPLL 72 is varied with an increment of T/2. The DPLL 72, however, is capable of easily coping with this difference by advancing the phase discrimination within the DPLL 72 with an increment of T/2.

When the period of preamble terminates and the period of UW or that of data proper sets in, the bit pattern is no longer fixed. As a result, the phase difference signal 6 assuming any of a total of 16 foci is applied as an input to the clock recovery signal generating circuit 71A. Detection No. 1 and Detection No. 2 mentioned above have due respect paid to the loci particularly during the period of preamble. Even during the period of UW or that of data proper, the assumption of such loci as are related to Detection No. 1 and Detection No. 2 possibly arises. The loci related to Detection No. 3 correspond to the period of UW and that of data proper. The number of loci along which the adjustment of timing is effected by Detection No. 3 is 8 as described specifically hereinafter.

FIG. 8a, FIG. 8b, FIG. 8c, FIG. 8d, and FIG. 8e aid in the description of the relation of the total of 16 loci and the adjustment of output timing of the clock recovery pulse. Now, the relation between the loci of the phase difference signal 6 and the adjustment of timing will be described below with reference to FIG. 8a, FIG. 8b, FIG. 8c, FIG. 8d, and FIG. 8e. For the sake of convenience of the explanation, the total of 16 loci are depicted as divided in five diagrams.

Figure 8A:
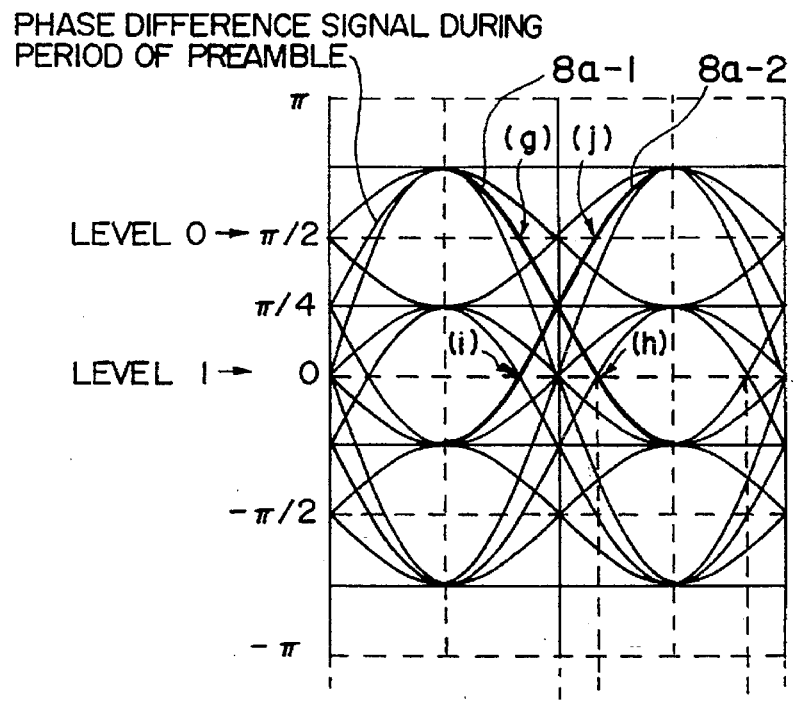
FIG. 8a is a diagram showing the locus pattern of a phase difference signal.

In FIG. 8a, the two locus patterns 8a-1 and 8a-2 are indicated each with a bold line.

First, the locus pattern 8a-1 will be explained. The timer circuit 705 of the locus sorting circuit 710 admits the level 0 cross pulse S703 as an input from the magnitude comparator 703 and starts counting (at the time point g). Then, within the fixed time Td from the time point g, the timer circuit 705 admits the level 1 cross pulse S701 as an input from the magnitude comparator 701 and terminates the counting (at the time point h). The discriminating circuit 705 determines that the count data S705 is shorter than the fixed time Td. Detection No. 1 (refer to FIG. 6a) is obtained in consequence of the operation described above.

After the elapse of the time |t0 +T/2| from the time point g, the discriminating circuit 706 emits the timing adjusting signal S706 as an output to the timing control circuit 707.

In the same manner as described above with respect to the period of preamble, the timing control circuit 707 undergoes the adjustment of timing by the locus sorting circuit 710 and, in consequence thereof, emits the clock recovery signal S707 at such a timing that the eye pattern may be opened to the widest extent.

Now, the locus pattern 8a-2 will be explained below. The timer Circuit 705 of the locus sorting circuit 710 admits the level 1 cross pulse S701 as an input from the magnitude comparator 701 and starts counting (at the time i). Then, within the fixed time Td from the time i, the timer circuit 705 admits the level 0 cross pulse S703 as an input from the magnitude comparator 703 and terminates the counting (at the time j). The discriminating circuit 705 determines that the count data S705 is shorter than the fixed time Td.

Detection No. 2 (see FIG. 6a) is obtained in consequence of the operation described above.

Then, after the elapse of the time |t0 +T/2| from the time i, the discriminating circuit 706 generates the timing adjusting signal S706 as an output to the timing control circuit 707.

In the same manner as described above with respect to the period of preamble, the timing control circuit 707 undergoes the adjustment of timing by the locus sorting circuit 710 and, in consequence thereof, generates the clock recovery signal S707 et such a timing that the eye pattern may be opened to the widest extent.

Figure 8B:
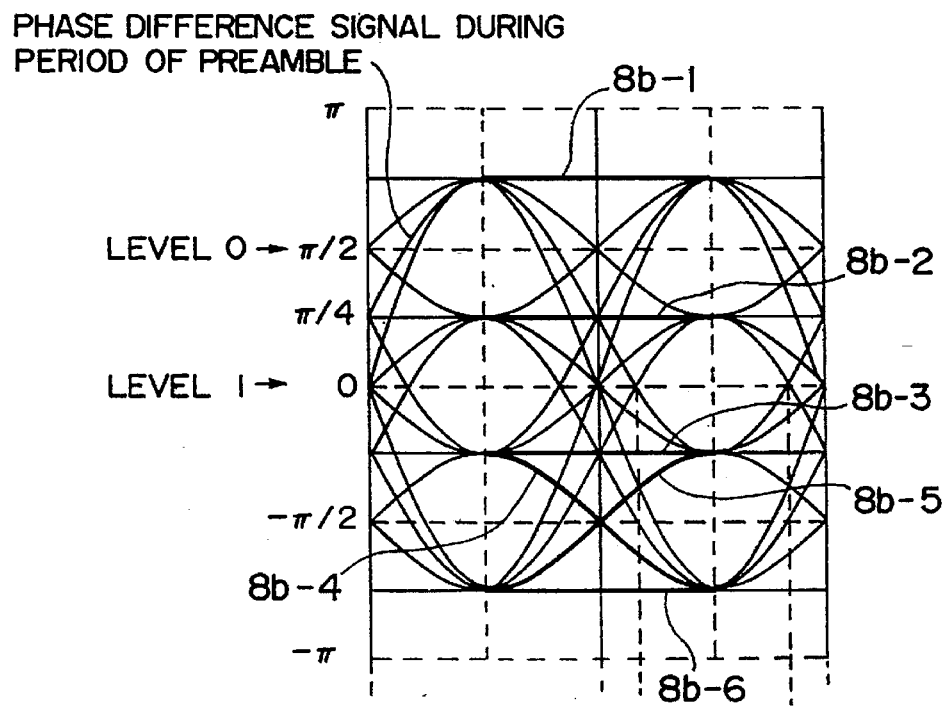
FIG. 8b is a diagram showing the locus pattern of a phase difference signal.

In FIG. 8b, the six locus patterns 8b-1, 8b-2, 8b-3, 8b-4, 8b-5, and 8b-6 are indicated each with a bold line.

None of these locus patterns crosses either the 0 or the 1 detection level. In this case, none of the conditions for detection indicated for Detection No. 1 through No. 3 in FIG. 6a is applicable. Thus, the adjustment of timing by the locus sorting circuit 710 is not carried out on any of these locus patterns. Then, the timing control circuit 707 does not generate the clock recovery signal S707.

Figure 8C:
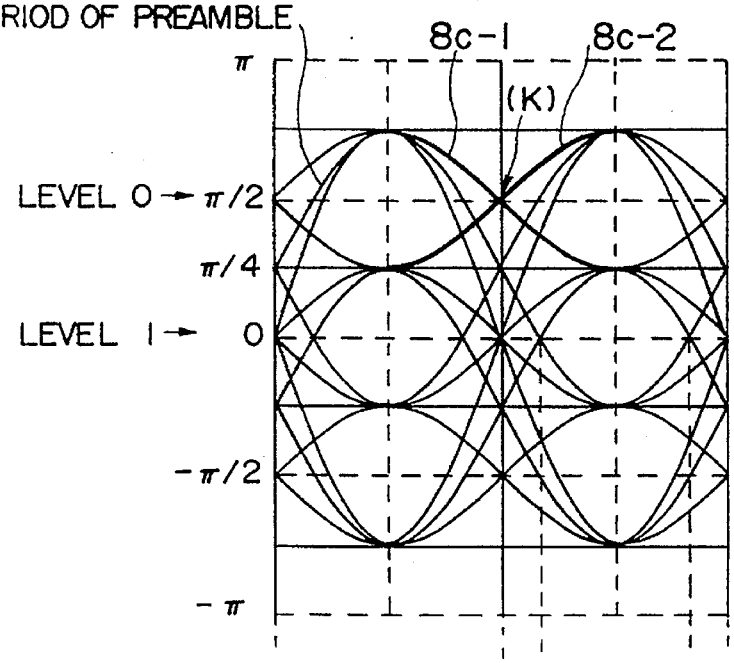
FIG. 8c is a diagram showing the locus pattern of a phase difference signal.

In FIG. 8c, the two locus patterns 8c-1 and 8c-2 are indicated each with a bold line.

Now, the two locus patterns 8c-1 and 8c-2 will be explained below. The timer circuit 705 of the locus sorting circuit 710 admits the level 0 cross pulse S703 as an input from the magnitude comparator 703 and starts counting (at the time point k). Within the fixed time Td from the time point k, however, neither of these two locus patterns 8c-1 and 8c-2 crosses either the 0 or the 1 detection level S702 or S704. Thus, none of the conditions for detection indicated for Detection No. 1 through No. 3 in FIG. 6a is applicable. Thus, the adjustment of timing by the locus sorting circuit 710 is not carried out on either of these two locus patterns 8c-1 and 8c-2. Then, the timing control circuit 707 does not generate the clock recovery signal S707.

Figure 8D:
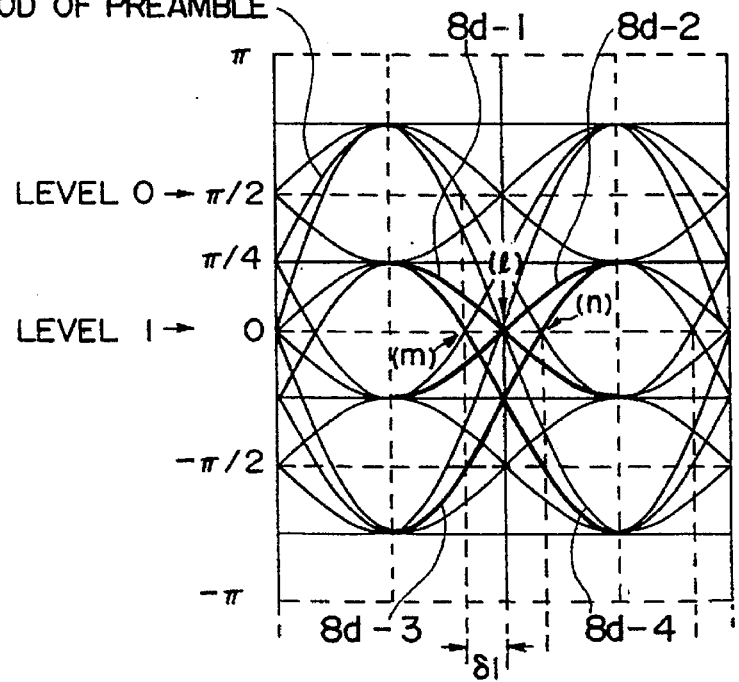
FIG. 8d is a diagram showing the locus pattern of a phase difference signal.

In FIG. 8d, the four locus patterns 8d-1, 8d-2, 8d-3, and 8d-4 are indicated each with a bold line.

Now, the four locus patterns 8d-1, 8d-2, 8d-3, and 8d-4 will be explained below. The timer circuit 705 of the locus sorting circuit 710 admits the level 1 cross pulse S701 as an input from the magnitude comparator 701 and starts counting (at the time points l, m, and n). Within the fixed time Td from the relevant time points (l, m, and n), however, none of the four locus patterns 8d-1, 8d-2, 8d-3, and 8d-4 crosses either of the 0 and the 1 detection level S702 or S704.

The present case falls under the condition of detection of Detection No. 3 of FIG. 6a. The timing control circuit 707, therefore, undergoes the adjustment of timing effected by the locus sorting circuit 710. Then, the timing control circuit 707 generates the clock recovery signal S707 after the elapse of the fixed time T/2 from the times (l, m, and n) of crossing.

Here, the timing control circuit 707 generates the clock recovery signal S707 with respect to the two most gradually inclined locus patterns 8d-1 and 8d-2 in all the four locus patterns 8d-1, 8d-2, 8d-3, and 8d-4 as shown in FIG. 8d at such a timing that the eye pattern may be opened to the widest extent. Then, the timing control circuit 707 generates the clock recovery signal S707 deviated by a fixed amount (jitter ±δ1) from the time at which the eye pattern is opened to the widest extent with respect to the other two most sharply inclined locus patterns 8d-3 and 8d-4.

In FIG. 8e, the two locus patterns 8e-1 and 8e-2 are indicated each with a bold line. Neither of these locus patterns represents a signal during the period of preamble.

First, the locus pattern 8e-1 will be explained below. The timer circuit 705 of the locus sorting circuit 710 admits the level 0 cross pulse S703 as an input from the magnitude comparator 703 and starts counting (at the time o). Then, within the fixed time Td from the time o, the timer circuit 705 admits the level 1 cross pulse S701 as an input from the magnitude comparator 701 and terminates the counting (at the time p. The discriminating circuit 705 then determines that the count data S705 is shorter than the fixed time Td. Detection No. 1 (refer to FIG. 6a) is obtained in consequence of the operation described above.

Then, after the elapse of the time |t0+T/2| from the time o, the discriminating circuit 706 generates the. timing adjusting signal S706 as an output to the timing control circuit 707.

Now, the locus pattern 8e-2 will be explained below. The timer circuit of the locus sorting circuit 710 admits the level 1 cross pulse S701 as an input from the magnitude comparator 710 and starts counting (at the time p). Then, within the fixed time from the time point p, the timer circuit 705 admits the level 0 cross pulse S703 as an input from the magnitude comparator 703 and terminates the counting (at the time q). The discriminating circuit 705 determines that the count data S705 is shorter than the fixed time Td. Detection No. 2 (refer to FIG. 6a) is obtained in consequence of the operation described above.

Then, after the elapse of the time |t0+T/2| from the time p, the discriminating circuit 706 emits the timing adjusting signal S706 as an output to the timing control circuit 707.

These locus patterns, however, invariably produce a latter cross earlier or later than the locus patterns which mainly occur during the period of preamble shown in FIG. 7a. Thus, the time at which the clock recovery pulse is generated is deviated by a fixed amount (jitter ±δ2) from the most desirable time at which the eye pattern is opened to the widest extent.

In the clock recovery signal generating circuit 71A of the first example, the clock recovery signal S707 having no jitter can be extracted perfectly and applied into the DPLL 72 during the reception of the pattern of the period of preamble as described above. Further, the clock signal generated from the DPLL 72 can be quickly led in at a correct phase angle and this correct phase angle can be stably maintained.

Even after the pattern of the period of preamble has ceased to exist, the clock recovery signal generating circuit 71A of the first example can extract the clock recovery pulse with a probability of ½ (8 out of 16 chances) and inject it into the DPLL 72. Then, the clock recovery signal generating circuit 71A can be utilized for the control of the phase of the clock signal generated from the DPLL 72. The clock recovery pulses which are extracted as described above include those having jitters with a probability of ½ (4 out of 8 chances). Even when the DPLL 72 happens to utilize such a clock recovery pulse as entails a jitter, this clock recovery pulse amply functions in following the input signal because the phase error between the regenerated clock signal and the input signal has been fully minimized during the period of preamble.

The clock recovery signal generating circuit 71A described above, therefore, attains detection of the phase of the phase difference signal 6 by utilizing the cross phase relative to the plurality of detection levels (detection axes). Further, the clock recovery signal generating circuit 71A mentioned above is so adapted as to generate clock recovery pulses having no jitter. The clock recovery signal generating circuit 71A, therefore, is capable of quickly and correctly synchronizing the clock signal with the phase of the input signal during the period of preamble. Further, the clock recovery signal generating circuit 71A is generating clock recovery signals S707 which have no jitter. As a result, the clock recovery signal generating circuit 71A is capable of precluding the otherwise possible occurrence of the so-called state of deadlock. Further, the DPLL 72 is not always required to be provided with a device capable of precluding the occurrence of the state of deadlock.

Besides, the clock recovery signal generating circuit 71A mentioned above is capable of generating a clock recovery signal S707 with a high probability even after the period of preamble has terminated. Further, the clock recovery signal generating circuit 71A permits continuous follow of the clock recovery signal S707. The clock recovery signal generating circuit 71A, therefore, can markedly decrease the possibility of disrupting synchronism from the conventional standard.

As a result, the DPLL 72 is enabled to generate clock signals of ideal quality.

Further, the clock recovery signal generating circuit 71A does not need to discriminate the origin of the input signal to the differential demodulator between the preamble and the UW or data proper. In addition, the clock recovery signal generating circuit 71A can repress the inevitable increase in the size thereof to the smallest possible extent and, at the same time, has no possibility of imposing any burden on an external microprocessor.

The clock recovery signal is generated in consequence of the operation described above.

Figure 9:
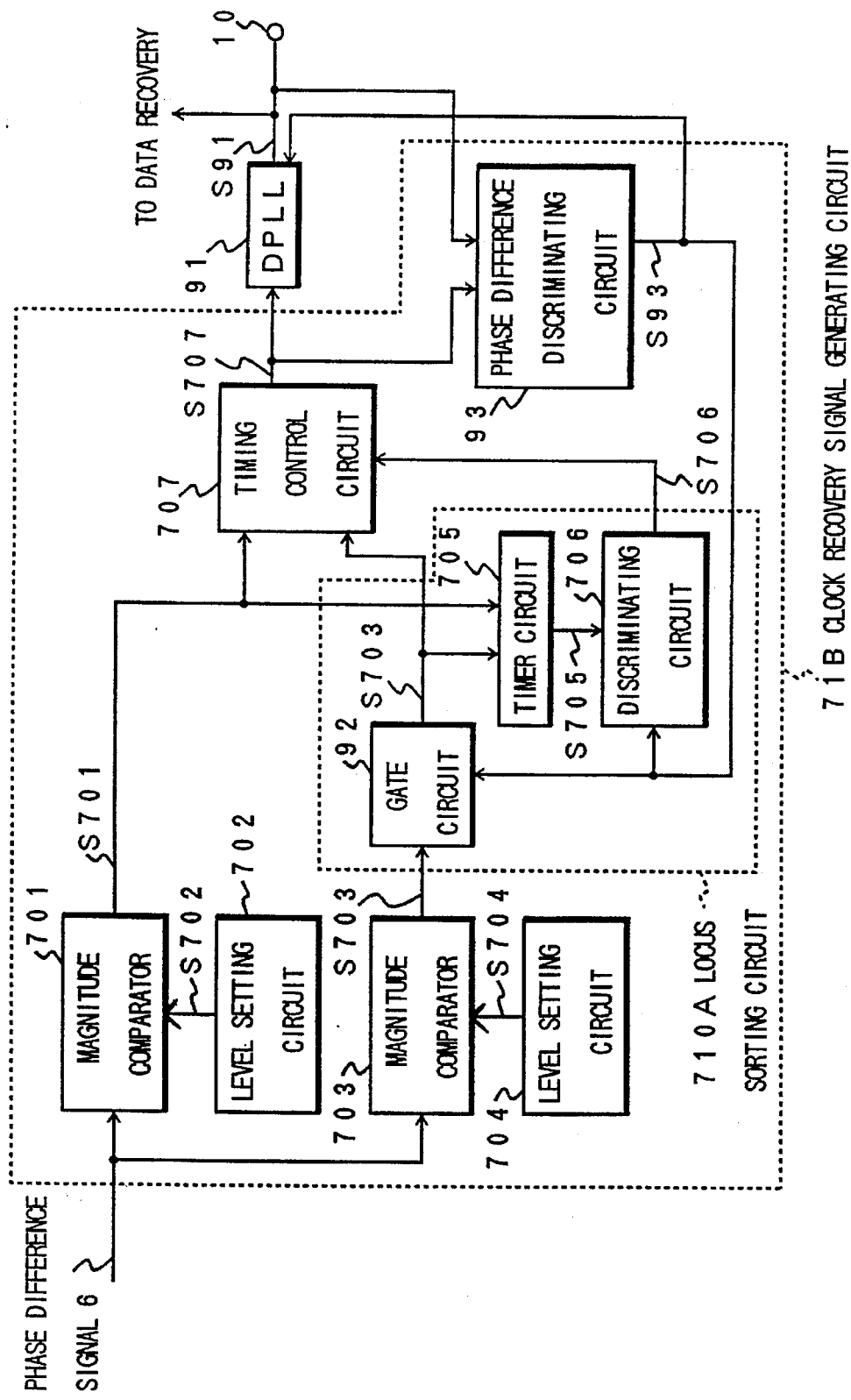
FIG. 9 is a block diagram illustrating a second example of the clock recovery signal generating circuit of the present invention.

Now, the second example of the clock recovery signal generating circuit of this invention will be described in detail below with reference to the drawings. FIG. 9 is a block diagram illustrating in detail the construction of the second example.

A clock recovery circuit is composed of a clock recovery signal generating circuit 71B and a DPLL circuit 91.

The clock recovery signal generating circuit 71B is composed of the magnitude comparators 701 and 703, the level setting circuits 702 and 704, a locus sorting circuit 710A, the timing control circuit 707, and a phase difference discriminating circuit 93. The locus sorting circuit 710A is composed of the timer circuit 705, the discriminating circuit 706, and a gate circuit 92. Here, the magnitude comparator 701 and the level setting circuit 702 are disposed correspondingly and the magnitude comparator 703 and the level setting circuit 704 are similarly disposed correspondingly in the same manner as in the first example.

The DPLL circuit 91 is adapted to switch the low-speed mode for effecting the follow of a phase at a low speed and the high-speed mode for effecting the follow of a phase at a high speed, depending on the magnitude of the phase difference between the clock recovery signal S707 and the generated clock signal. Incidentally, one example of the DPLL 91 of this performance is disclosed in JP-A-61-265, 922.

Now, the construction of the clock recovery signal generating circuit 71B will be explained below.

The magnitude comparators 701 and 703 and the level setting circuits 702 and 704 are identical in construction with those used in the clock recovery signal generating circuit 71A of the first example.

The locus sorting circuit 710A is composed of the timer circuit 705, the discriminating circuit 706, and the gate circuit 92.

To the gate circuit 92 are applied the level 0 cross pulse S703 generated from the magnitude comparator 703 and a mode signal S93 generated from the phase difference discriminating circuit 93. Here, the mode signal S93 in the gate circuit 92 is utilized as a signal for controlling the output of the level 0 cross pulse S703. Then, the gate circuit 92 issues the level 0 cross pulse S703 as an output to the timer circuit 705 when the mode signal S93 designates the high-speed control mode. The gate circuit 92 does not pass the level 0 cross pulse S703 to the timer circuit 705 when the mode signal S93 designates the low-speed control mode. Sere, the high-speed control mode refers to the state of Detection No. 1 to No. 3 described in the first example (refer to FIG. 6a and FIG. 10). The low-speed control mode refers to the state of Detection No. 4. Detection No. 4 denotes the state in which the timing control circuit 707 emits the clock recovery signal S707 after the elapse of the time |T/2| from the time at which the gate circuit 92 admits the level 1 cross pulse S701 as an input from the magnitude comparator 701 (refer to FIG. 10).

To the timer circuit 705 are applied the level 1 cross pulse S701 and the level 0 cross pulse S703.

The discriminating circuit 706 is identical in construction with the discriminating circuit described in the first example and also identical in operation therewith.

The timing control circuit 707 is identical in construction with the timing control circuit described in the first example and also identical in operation therewith. The timing control circuit 707 emits the clock recovery signal S707 as an output to the DPLL circuit 91 and the phase difference discriminating circuit 93.

To the phase difference discriminating circuit 93 are applied the clock recovery signal S707 and a clock signal S91. These signals are used for the determination of phase difference.

Also in the clock recovery signal generating circuit 71B of the second example, the operation of Detection No. 1 or No. 2 in the high-speed control mode is proceeding during the reception of the period of preamble. The clock recovery signal generating circuit 71B is capable of extracting a jitter-free clock recovery pulse perfectly and inject it into the DPLL circuit 91. As a result, the clock recovery signal generating circuit 71B can quickly lead in the phase of the clock signal S91 generated from the DPLL circuit 91 in a correct phase angle.

When the clock signal S91 is drawn in at a desired phase angle (within $\pi/4$, for example) during or after the period of preamble as described above, the high-speed control mode is switched to the low-speed control mode by the phase difference discriminating circuit 93.

The locus sorting circuit 710A, therefore, executes the operation of Detection No. 4 based exclusively on the level 1 cross pulse. At the same time, the DPLL circuit 91 also switches to the low-speed control mode and carries out the control of the generated phase of the clock signal S91 at a low speed so as to maintain the stabilized state thereof.

The present second example likewise contemplates detecting the phase in the phase difference signal 6 by utilizing the cross phase relative to the plurality of detection levels (detection axes) and consequently generating the clock regenerating signal S707. The clock recovery circuit, therefore, is capable of quickly and correctly synchronizing the clock signal S91 with the phase of the input signal during the period of preamble. Further, the clock recovery circuit can continuously generate and follow the clock recovery signal S707 with a high degree of probability even after the termination of the period of preamble and can markedly reduce the possibility of disrupting synchronism. Since the control of phase is effected at a low speed after the clock signal S91 has been led into the phase of the input signal, the clock signal S91 acquires a stable phase substantially regardless of the possibility that the magnitude comparator 701 or 703 will generate a pulse in response to such an extraneous signal as noise.

The second example, therefore, can meet the contradictory demands, i.e. quick entrance of clock and stable recovery of clock, more satisfactorily than the first example.

The examples cited thus far represent cases of using two detection levels (detection axes) for the estimation of loci of a phase difference signal. The present invention does not need to be limited to these cases. It allows use of three or more detection levels when necessary. In this case, the number of sorts of locus (kinds of control of the timing control circuit 707) may be selected so as to suit the number of detection levels.

The examples cited above also represent cases of resorting to the precondition that the pattern of the period of preamble should be repetitions of "1001." This invention allows use of other preamble patterns. In this case, the sortation of loci and the adjustment of output timing of the clock recovery pulses may be implemented in conformity with the particular preamble pattern to be adopted.

Figure 11:
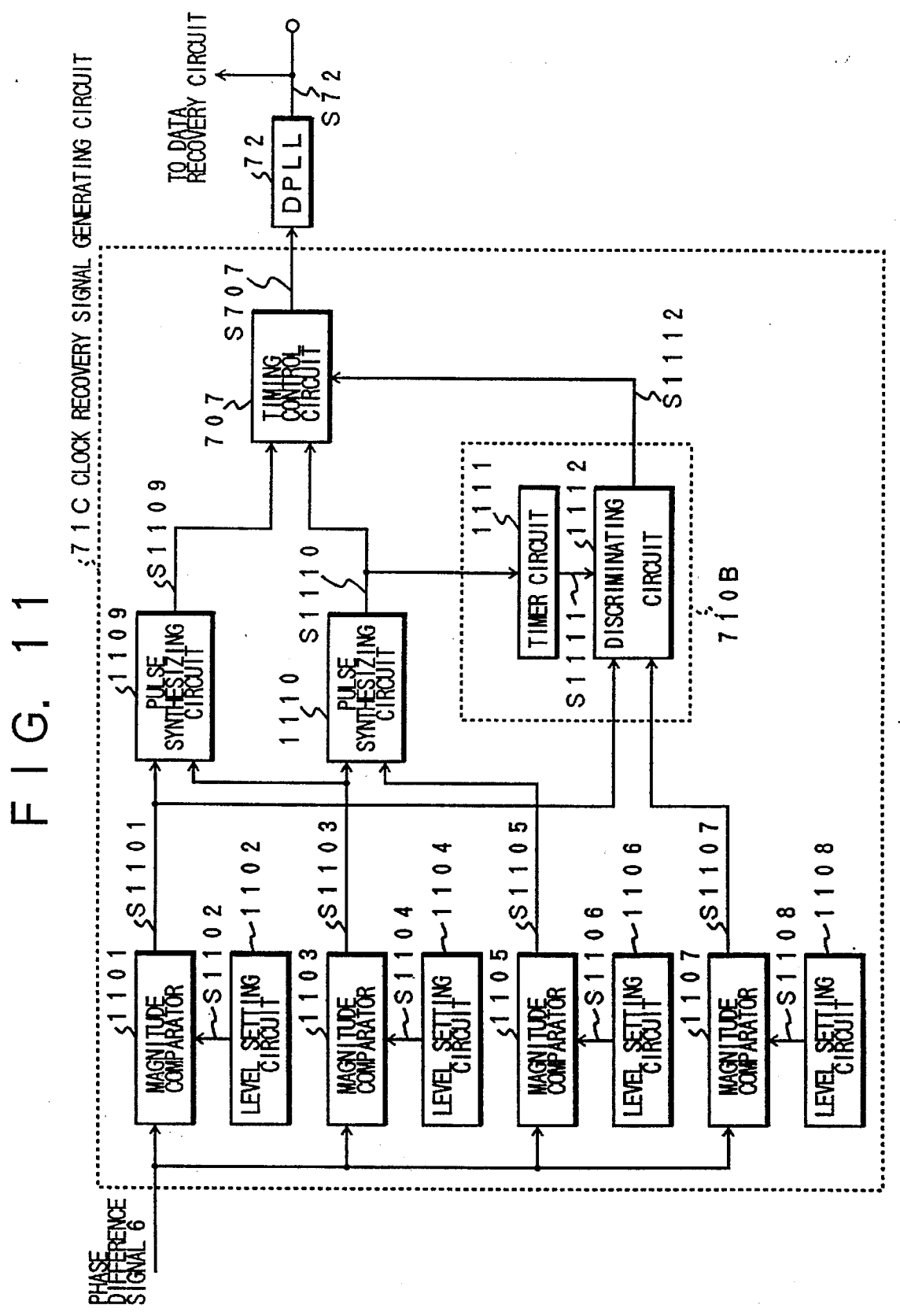

Now, the third example of the clock recovery signal generating circuit of this invention will be described in detail below with reference to the drawings. FIG. 11 is a block diagram illustrating in detail the construction of the third example.

The clock recovery circuit is composed of a clock recovery signal generating circuit 71C and the DPLL circuit 72.

The clock recovery signal generating circuit 71C is composed of magnitude comparators 1101, 1103, 1105, and 1107, level setting circuits 1102, 1104, 1106, and 1108, pulse synthesizing circuits 1109 and 1110, a locus sorting circuit 710B, and the timing circuit 707. The locus sorting circuit 710B is composed of a timer circuit 1111 and a discriminating circuit 1112. Here, the magnitude comparator 1101 and the level setting circuit 1102, the magnitude comparator 1103 and the level setting circuit 1104, the magnitude comparator 1105 and the level setting circuit 1106, and the magnitude comparator 1107 and the level setting circuit 1108 are severally disposed correspondingly.

The DPLL circuit 72 is identical in construction with the circuit described in the first example and also identical in operation therewith.

Now, the construction and operation of the clock recovery signal Generating circuit 71C will be described below.

Figure 13:
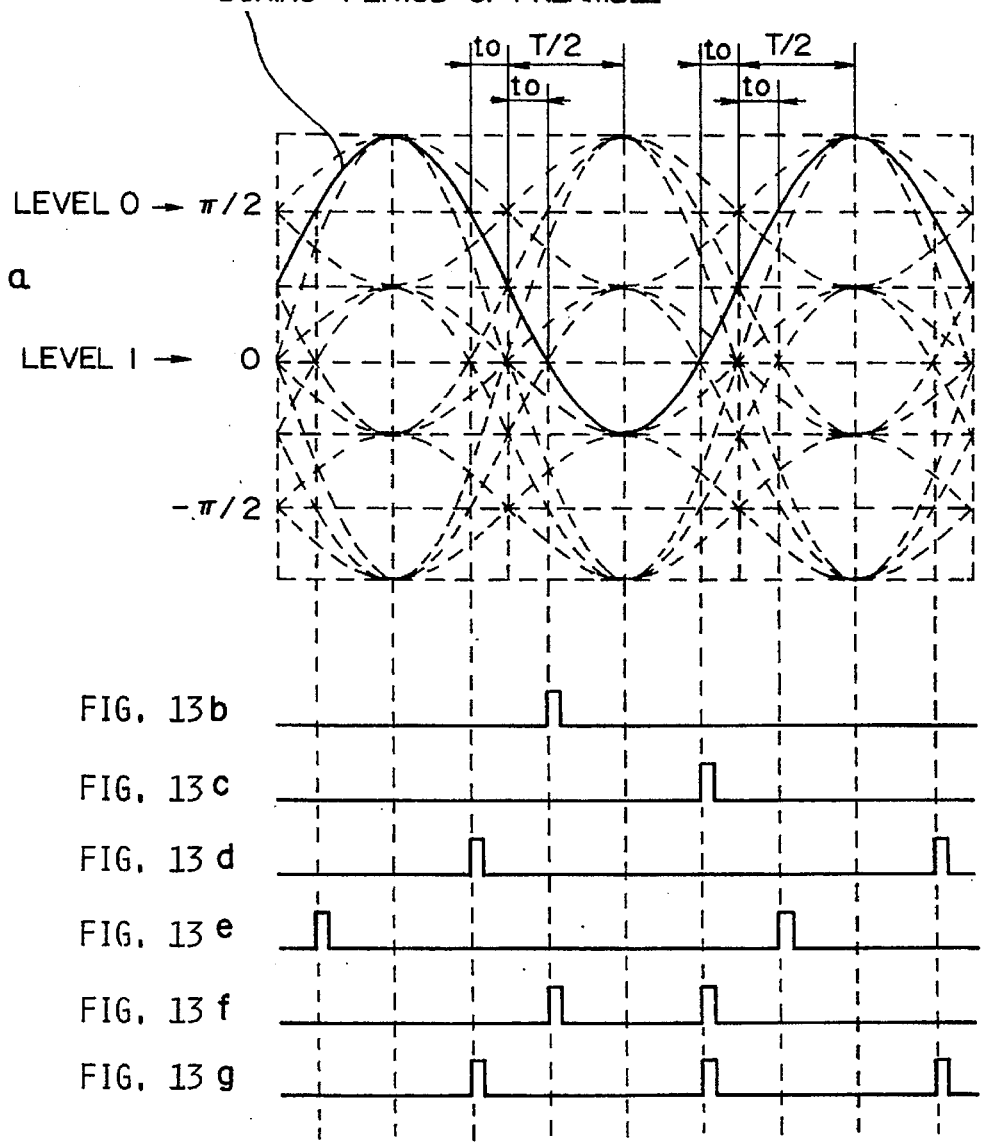
FIGS. 13a–13g are diagrams showing the locus pattern of a phase difference signal and the timing of generation of a pulse.

To the magnitude comparator 1101 are injected the phase difference signal 6 and a magnitude of detection level S1102 issued from the level setting circuit 1102. The magnitude comparator 1101 determines, whether or not the phase difference signal 6 admitted therein changes in the direction of $\pi \rightarrow -\pi$ and also determines whether or not the input phase difference signal 6 is equal to the magnitude of detection level S1102. The magnitude comparator 1101 Generates a pulse S1101 only when the input phase difference signal 6 satisfies the conditions mentioned above. The magnitude comparator 1101 emits the generated pulse S1101 as an output to the pulse synthesizing circuit 1109 and the discriminating circuit 1112 of the locus sorting circuit 710B. Here, the level setting circuit 1102 has level 1 corresponding to the phase difference 0 set as the magnitude of detection level S1102 (refer to FIG. 13a). The magnitude of detection level S1102 in this case represents the case in which the phase difference signal 6 has changed in the direction of from $\pi$ to $-\pi$. The magnitude comparator 1101, therefore, generates the pulse S1101 when the phase difference signal 6 has changed in the direction of from $\pi$ to $-\pi$ and has crossed the magnitude of detection level S1102 (refer to FIG. 13b).

To the magnitude comparator 1103 are applied the phase difference signal 6 and the magnitude of detection level S1104 generated from the level setting circuit 1104. The magnitude comparator 1103 determines whether or not the phase difference signal 6 admitted therein changes in the direction of $-\pi \rightarrow \pi$ and, at the same time, determines whether or not the input phase difference signal 6 is equal to the magnitude of detection level S1104. The magnitude comparator 1103 generates a pulse S1103 only when the phase difference signal 6 admitted therein satisfies the conditions mentioned above. Then, the magnitude comparator 1103 emits the generated pulse S1103 as an output to the pulse synthesizing circuits 1109 and 1110. Here, the level setting circuit 1104 has level 1 corresponding to the phase difference 0 set as the magnitude of detection level S1104 (refer to FIG. 13a). The magnitude of detection level S1104 of the level setting circuit 1104 represents the case in which the phase difference signal 6 has changed in the direction of from $-\pi$ to $\pi$. The magnitude of detection level S1104 in this case denotes the change of the phase difference signal 6 in the direction of from $-\pi$ to $\pi$. The magnitude comparator 1103, therefore, generates the pulse S1103 when the phase difference signal 6 has changed in the direction of from $-\pi$ to $\pi$ and has crossed the magnitude of detection level S1104 (refer to FIG. 13c).

To the magnitude comparator 1105 are injected the phase difference signal 6 and the magnitude of detection level S1106 issued from the level setting circuit 1106. The magnitude comparator 1105 determines whether or not the phase difference signal 6 admitted therein changes in the direction of $\pi \rightarrow -\pi$ and, at the same time, determines whether or not the input phase difference signal 6 is equal to the magnitude of detection level S1106. The magnitude comparator 1105 generates the pulse S1105 only when the input phase difference signal 6 satisfies the conditions mentioned above. Then, the magnitude comparator 1105 emits the generated pulse S1105 as an output to the pulse synthesizing circuit 1110. Here, the level setting circuit 1106 has level 0 corresponding to the phase difference $\pi/2$ set as the magnitude of detection level S1106 (refer to FIG. 13a). The magnitude of detection level S1106 of the level setting circuit 1106 represents the case in which the phase difference signal 6 has changed in the direction of from $\pi$ to $-\pi$. The magnitude comparator 1105, therefore, generates the pulse S1105 when the phase difference signal 6 has changed in the direction of from $\pi$ to $-\pi$ and has crossed the magnitude of detection level S1106 (refer to FIG. 13d).

To the magnitude comparator 1107 are injected the phase difference signal 6 and the magnitude of detection level S1108 emitted from the level setting circuit 1108. The magnitude comparator 1107 determines whether or not the phase difference signal 6 admitted therein changes in the direction of $-\pi \rightarrow \pi$ and, at the same time, determines whether or not the input phase difference signal 6 is equal to the magnitude of detection level S1108. The magnitude comparator 1107 generates the pulse S1107 only when the phase difference signal 6 admitted therein satisfies the conditions mentioned above. Then, the magnitude comparator 1107 emits the generated pulse S1107 as an output to the discriminating circuit 1112 of the locus sorting circuit 710B. Herein, the level setting circuit 1108 has level 0 corresponding to the phase difference $\pi/2$ set as the magnitude of detection level S1108 (refer to FIG. 13a). The magnitude of detection level S1108 of the level setting circuit 1108 represents the case in which the phase difference signal 6 has changed in the direction of from $-\pi$ to $\pi$. The magnitude comparator 1107, therefore, generates the pulse S1107 when the phase difference signal 6. has changed in the direction of from $-\pi$ to $\pi$ and has crossed the magnitude of detection level S1108 (refer to FIG. 13e).

To the pulse synthesizing circuit 1109 are injected the pulse S1101 and the pulse S1103. The pulse synthesizing circuit 1109 obtains a magnitude of synthesis S1109 by computing the logical sum of the pulses S1101 and S1103 admitted therein (refer to FIG. 13f). Then, the pulse synthesizing circuit 1109 emits the magnitude of synthesis S1109 as an output to the timing control circuit 707.

To the pulse synthesizing circuit 1110 are injected the pulse S1103 and the pulse S1105. The pulse synthesizing circuit 1110 then obtains a magnitude of synthesis S1110 by computing the logical sum of the pulses S1103 and S1105 admitted therein (refer to FIG. 13g). Then, the pulse synthesizing circuit 1110 emits the magnitude of synthesis S1110 as an output to the timing circuit 707 and the timer circuit 1111 of the locus sorting circuit 710B.

Figure 14:
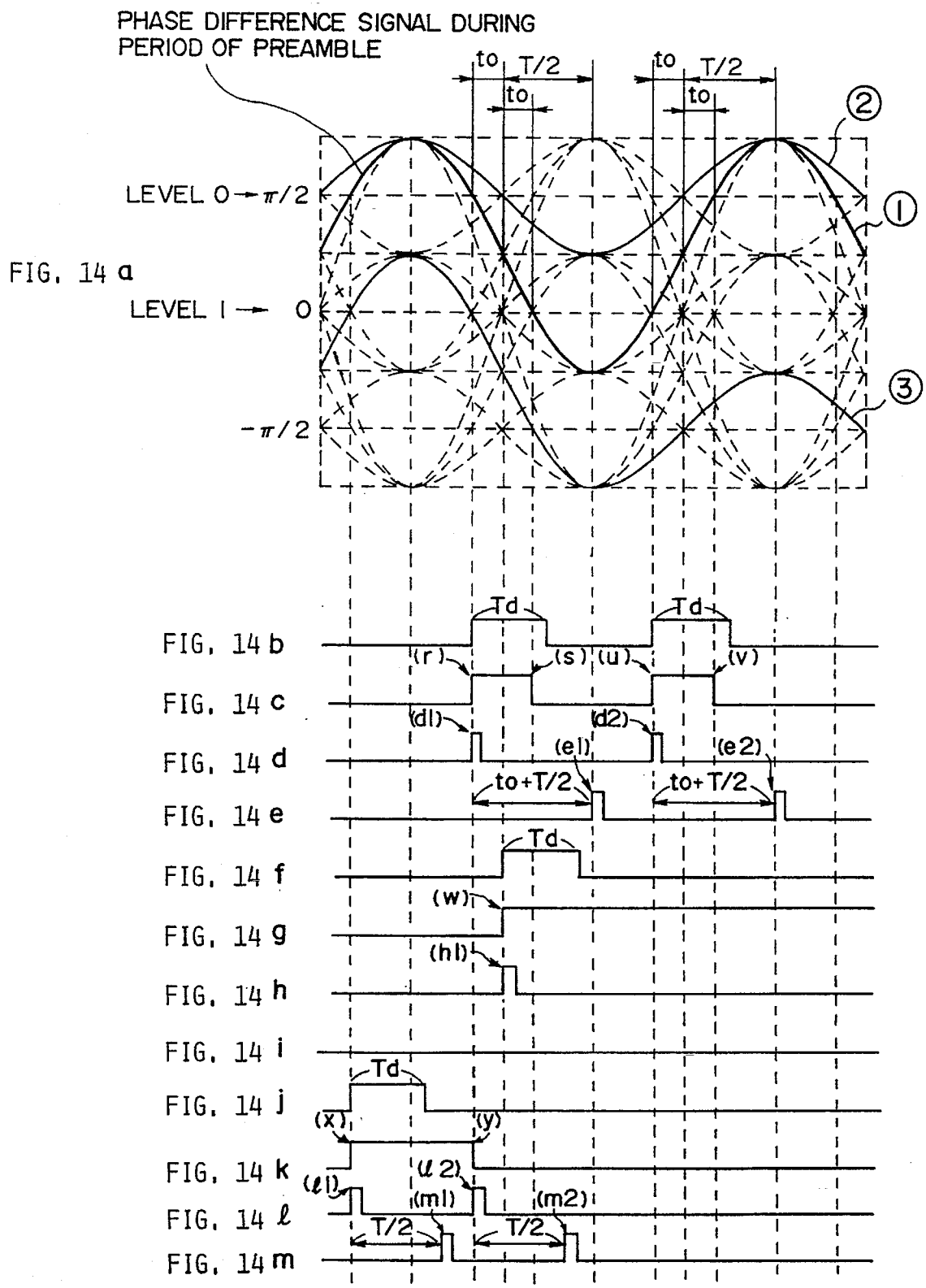
FIGS. 14a–14m are diagrams showing the locus pattern of a phase difference signal and the timing of generation of a pulse.

The locus sorting circuit 710B is composed of the timer circuit 1111 and the discriminating circuit 1112. The operation of the locus sorting circuit 710B will be explained below with reference to FIG. 14. FIG. 14a shows loci of a phase difference signal. In the diagram, the phase difference signal during the period of preamble is indicated as (1) and two typical phase difference signals not during the period of preamble are indicated as (2) and (3).

To the timer circuit 1111 is applied the magnitude of synthesis S1110. The timer circuit 1111, on admitting the magnitude of synthesis S1110, resets the timer and starts counting (clocking time). Here, the timer circuit 1111 stops automatically after the elapse of a fixed time (time of Td, in this case) after the start of counting. Then, the timer circuit 1111 emits a count data S1111 (numerical value obtained by counting) as an output to the discriminating circuit 1112. The count data S1111 denotes the information representing the elapse of a fixed time allowed for the counting (time Td in this case).

First, one example of the operation described above will be cited below with reference to the phase difference signal (1) during the period of preamble. The timer circuit 1111 continues the counting for the duration of the time Td from the time points of r and u and the emission of an H level to the discriminating circuit 1112 for the duration of the time Td (refer to FIGS. 14b and c). Similarly, in the case of the phase difference signal (2) not during the period of preamble, the counting is continued for the duration of the time Td from the time point of w. Then, in the case of the phase difference signal (3) not during the period of preamble, the counting is continued for the duration of the time Td from the time point of x. Then, the timer continues the emission of the H level to the discriminating circuit 1112 for the duration of the time Td (refer to FIGS. 14f, g, j, and k).

The discriminating circuit 1112 is possessed of an S-E reset discriminating part (not shown). Here, the symbol S-E used in the R-E reset discriminating part stands for START-END. The S-E reset discriminating part, on receiving the magnitude of synthesis S1110, retains the state of H level and, on receiving the pulse S1101 or pulse S1107, retains the state of L level. To the discriminating circuit 1112 are applied the count data 1111, the pulse S1101, and the pulse S1107. The discriminating circuit 1112 determines whether or not the count data S1111 and the pulse S1101 and the pulse S1107 so admitted therein satisfy the conditions of detection described above in the first example of the clock recovery signal generating circuit of this invention (refer to FIG. 6b).

Now, the operation of the discriminating circuit 1112 will be explained below with reference to FIG. 14. The counting of the time Td is started when the pulse crossing the level 0 has a minus inclination and when the pulse crossing the level 1 has a plus inclination.

First, the case in which the phase difference signal (1) during the period of preamble is applied in the discriminating circuit 1112 will be explained below with reference to FIGS. 14b, c, d, and e. The S-E reset discriminating part omitted from illustration herein starts retaining the H level (time points of r and u) when the magnitude of synthesis S1110 is applied into the timer circuit 1111 (time points of d1 and d2) to set the timer counting. Then, the S-E reset discriminating part starts retaining the L level (time points of s and v) when it admits the pulse S1101 or pulse S1107. Here, the discriminating circuit 1112 examines the state which the S-E reset discriminating part omitted from illustration herein assumes when the count data S1111 admitted therein has changed from the H level to the L level (namely when the counting of the time Td is completed). When the S-E reset discriminating part is found to be retaining the L level, the discriminating circuit 1112 selects the magnitude of synthesis S1110 in the timing control circuit 707 (Detection No. 1 and No. 2 shown in FIG. 6b). Here, the S-E reset discriminating part not shown herein receives the pulse S1101 (time point of s), the discriminating circuit 1112 emits as an output to the timing control circuit 707 a timing adjusting signal S1112 which instructs emission of a level 0 cross timing at the time point of e1 following the elapse of the time |t0+T/2| from the time point of d1 (Detection No. 1 shown in FIG. 6b). Then, the timing control circuit 707 retains the state of the level 0. When the S-E reset discriminating part not shown herein admits the pulse S1107 as an input (at the time point of v), the discriminating circuit 1112 at the time point of e2 after the elapse of the time |t0+T/2| from the time point of d2 emits the timing adjusting signal S1112 instructing emission of the level 1 cross timing as an output to the timing control circuit 707 (Detection No. 2 shown in FIG. 6b). Then, the timing control circuit 707 retains the state of level 1.

Now, the case in which the phase difference signal (2) not during the period of preamble is applied as an input into the discriminating circuit 1112 will be explained below with reference to FIGS. 14f, g, h, and i. When the magnitude of synthesis S1110 is applied into the timer circuit 1111 (at the time point of h1) and the timer is set counting, the S-E reset discriminating part not shown herein retains the H level (at the time point of w). Since neither the pulse S1101 nor the pulse S1107 is applied into the S-E reset discriminating part not shown herein, however, the S-E reset discriminating part continues retaining the H level. When the counting of the time Td is completed, the discriminating circuit 1112 examines the state retained by the S-E reset discriminating part not shown herein. Since the S-E reset discriminating part not shown herein retains the H level, the discriminating circuit 1112 selects the magnitude of synthesis S1109 in the timing control circuit (Detection No. 3 shown in FIG. 6b). Then, the discriminating circuit 1112 at the time after the elapse of the time |T/2| from the time h1 generates the timing adjusting signal S1112 instructing generation of the level 1 cross timing as an output to the timing control circuit 707 (Detection No. 3 shown in FIG. 6b). Here, the pulse synthesizing circuit 1109 has not detected the level 1. The timing control circuit 707 is not retaining the level 0. The timing control circuit 707, therefore, is incapable of generating the level 1 cross timing (FIG. 14i). Here, the timing control circuit 707 retains the former state.

Now, the case in which the phase difference signal (3) not during the period of preamble has been applied into the discriminating circuit 1112 will be explained below with reference to FIGS. 14j, k, l, and m. When the magnitude of synthesis S1110 is applied into the timer circuit 1111 (at the time 11) and the timer is set counting, the S-E reset discriminating part not shown herein retains the H level (at the time x). Here, the S-E reset discriminating part not shown herein retains the L level when the pulse S1101 is applied therein (at the time y). When the counting of the time Td is completed, the discriminating circuit 1112 examines the state retained by the S-E reset discriminating part not shown herein. Then, since the S-E reset discriminating part not shown herein is retaining the H level, the discriminating circuit 1112 selects the magnitude of synthesis S1109 in the timing control circuit 707 (Detection No. 3 shown in FIG. 6b). At the time m1 after the elapse of the time |T/2| from the time 11, the discriminating circuit 1112 generates the timing adjusting signal S1112 instructing the level 1 cross timing as an output to the timing control circuit 707 (Detection No. 3 shown in FIG. 6b). Then, the timing control circuit 707 retains the state of the level 1. It does not count the time Td at the time 12. Since the timing control circuit 707 is retaining the state of the level 1 and owing to the fact that the level 1 has been crossed, however, the timing adjusting signal S1112 instructing the level 1 cross timing is generated as an output to the timing control circuit 707 at the time point of m2 after the elapse of the time |T/2| from the time point of 12 (Detection No. 3 shown in FIG. 6b).

To the timing control circuit 707 are injected the magnitude of synthesis S1109 issued from the pulse synthesizing circuit 1109, the magnitude of synthesis S1110 issued from the pulse synthesizing circuit 1110, and the timing adjusting signal S1112 issued from the locus sorting circuit 710B. The timing control circuit 707 delays the magnitudes of synthesis S1109 and S1110 by a duration conforming to the instruction of the timing adjusting signal S1112 and generates the clock recovery signal S707. At this time, the timing control circuit 707 retains the state which has been designated by the timing adjusting signal S1112. Then, the timing control circuit 707 generates the clock recovery signal S707 as an output to the DPLL 72.

The clock recovery signal is generated in consequence of the operation described above.

Figure 12:
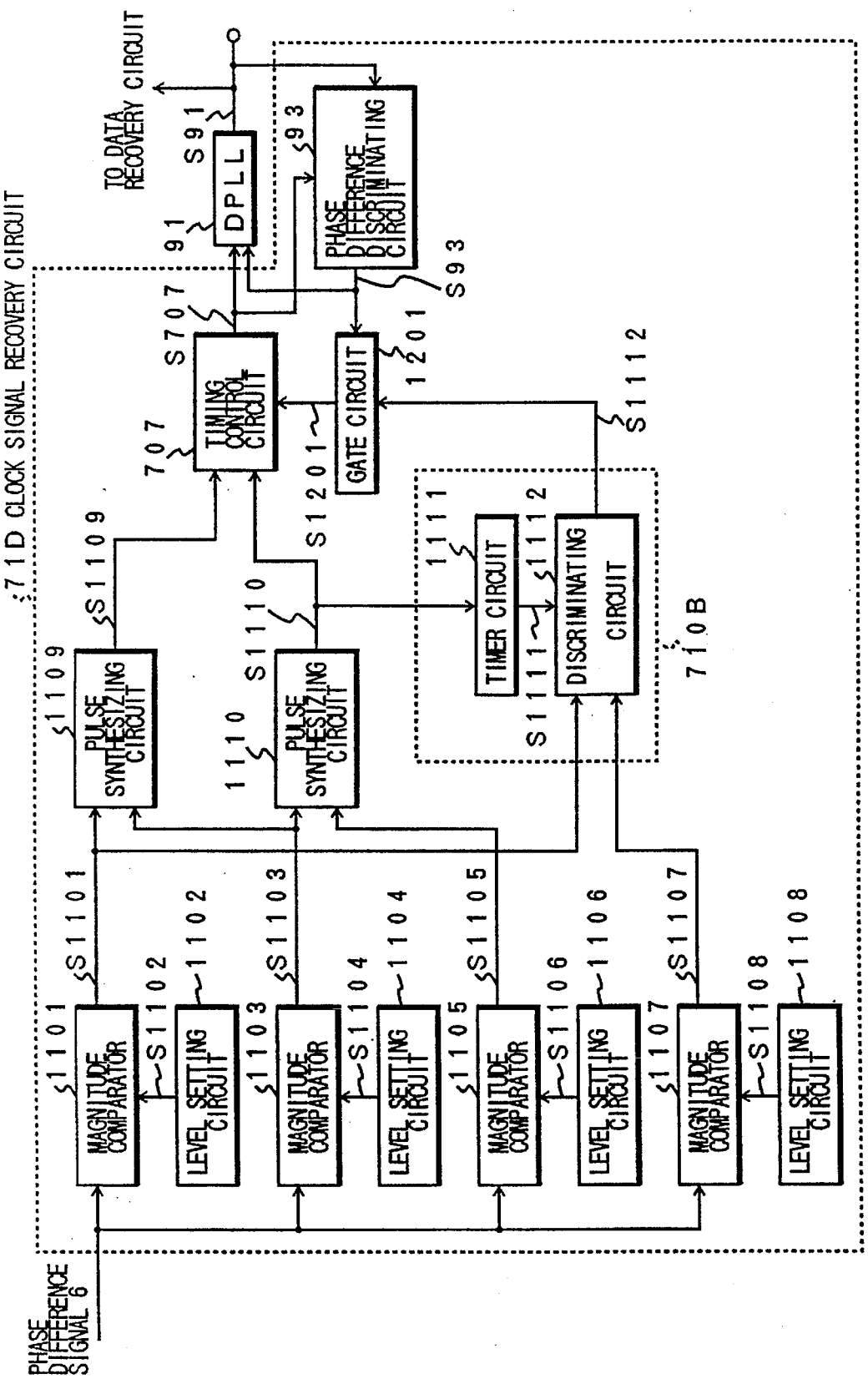
FIG. 12 is a block diagram illustrating a fourth example of the clock recovery signal generating circuit of the present invention.

Now, the fourth example of the clock recovery signal generating circuit of this invention will be described in detail below with reference to the drawings. FIG. 12 is a block diagram illustrating in detail the construction of the fourth example.

The clock recovery circuit is composed of a clock recovery signal generating circuit 71D and the DPLL circuit 91.

The clock recovery signal generating circuit 71D is composed of the magnitude comparators 1101, 1103, 1105, and 1107, the level setting circuits 1102, 1104, 1106, and 1108, the pulse synthesizing circuits 1109 and 1110, the locus sorting circuit 710B, the timing control circuit 707, a gate circuit 1201, and the phase difference discriminating circuit 93. The locus sorting circuit 710B is composed of the timer circuit 1111 and the discriminating circuit 1112. Here, the magnitude comparator 1101 and the level setting circuit 1102, the magnitude comparator 1103 and the level setting circuit 1104, the magnitude comparator 1105 and the level setting circuit 1106, and the magnitude comparator 1107 and the level setting circuit 1108 are severally disposed-correspondingly.

The DPLL circuit 91 is identical in construction with the circuit described above in the second example of the clock recovery signal generating circuit of this invention and is also identical in operation therewith.

Now, the construction and operation of the clock recovery signal generating circuit 71D will be explained below.

In FIG. 12, the magnitude comparators 1101, 1103, 1105, and 1107, the pulse synthesizing circuits 1109 and 1110, the timing control circuit 707, the locus sorting circuit 710B, and the phase difference discriminating circuit 93 are identical in both construction and operation with the circuits of like designations and like reference numerals described in the examples of the clock recovery signal generating circuit of this invention cited above. Here, the discriminating circuit 1112 of the locus sorting circuit 710B emits the timing adjusting signal S1112 generated in the discriminating circuit 1112 as an output to the gate circuit 1201. The timing control circuit 707 emits the clock recovery signal S707 generated in the timing control circuit 707 as an output to the DPLL 91 and the phase difference discriminating circuit 93.

Figure 15:
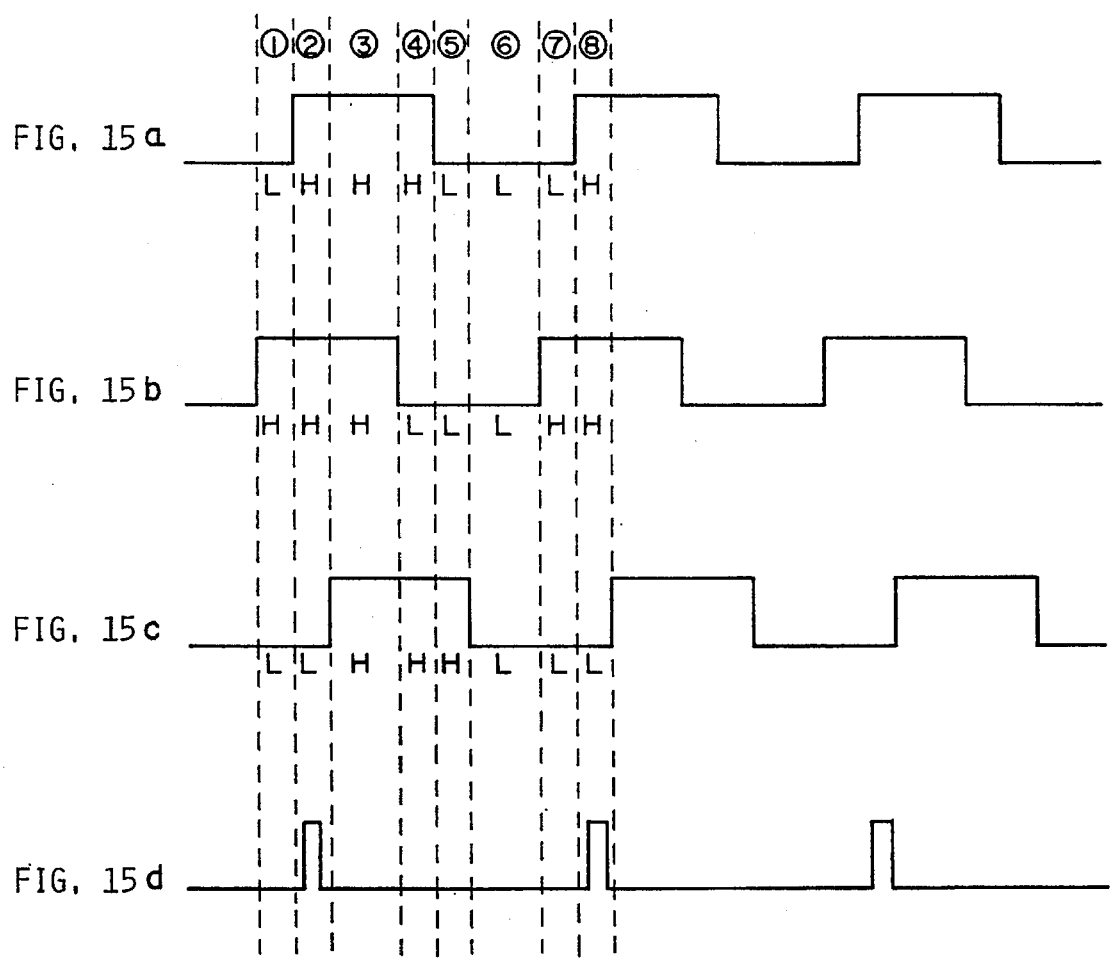
FIGS. 15a, 15b, 15c, and 15d are diagrams showing the present clock signal and the clock signals delayed by $\pi/4$ and advanced by $\pi/4$ respectively from the present clock signal.
Figure 16:
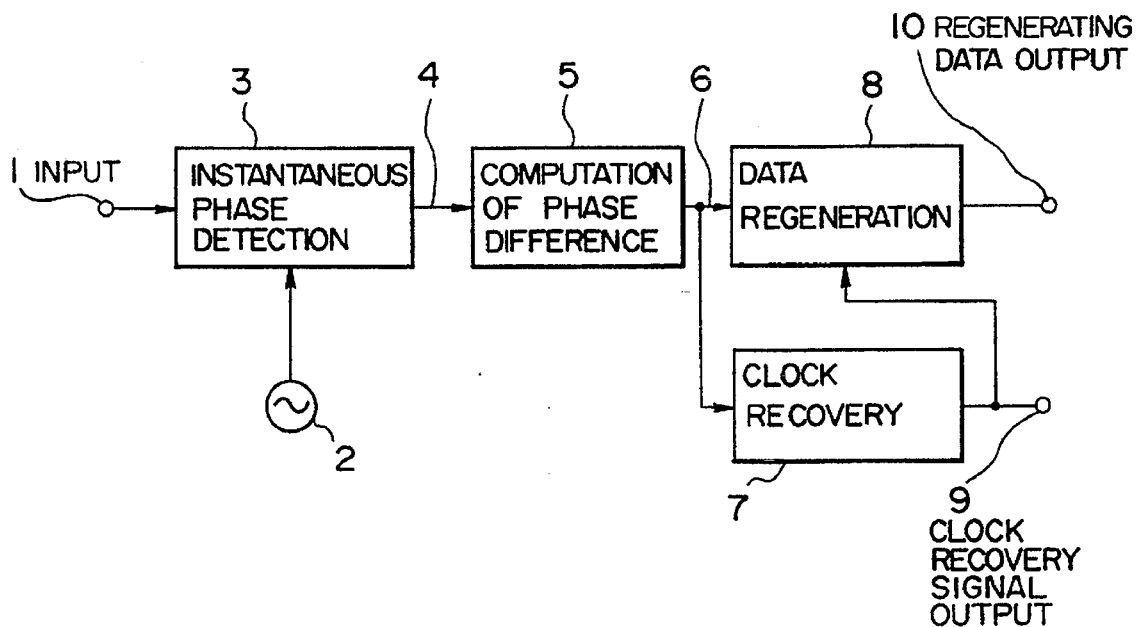
FIG. 16 is a block diagram illustrating a conventional differential demodulator.
Figure 17:
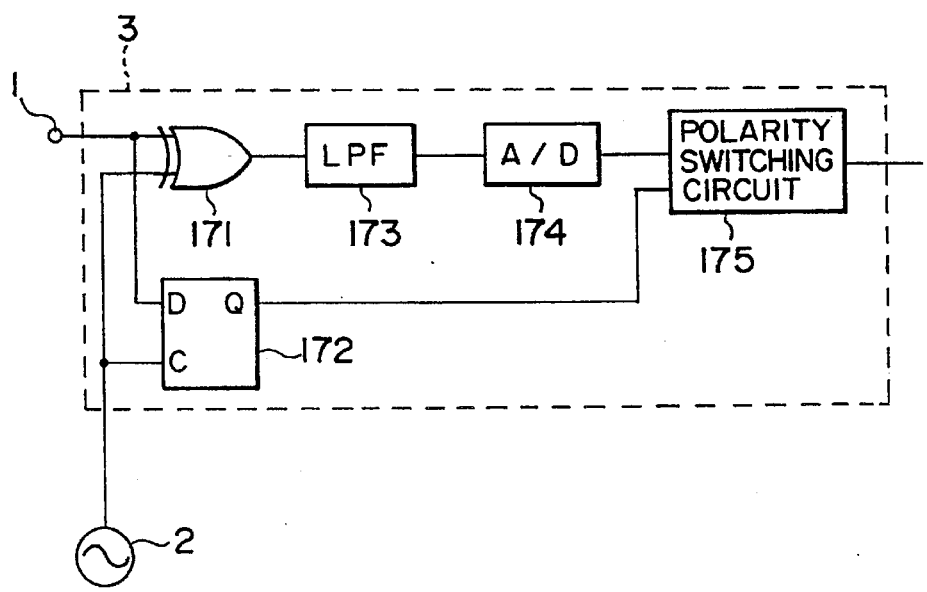
FIG. 17 is a block diagram illustrating a conventional instantaneous phase detecting circuit.
Figure 18:
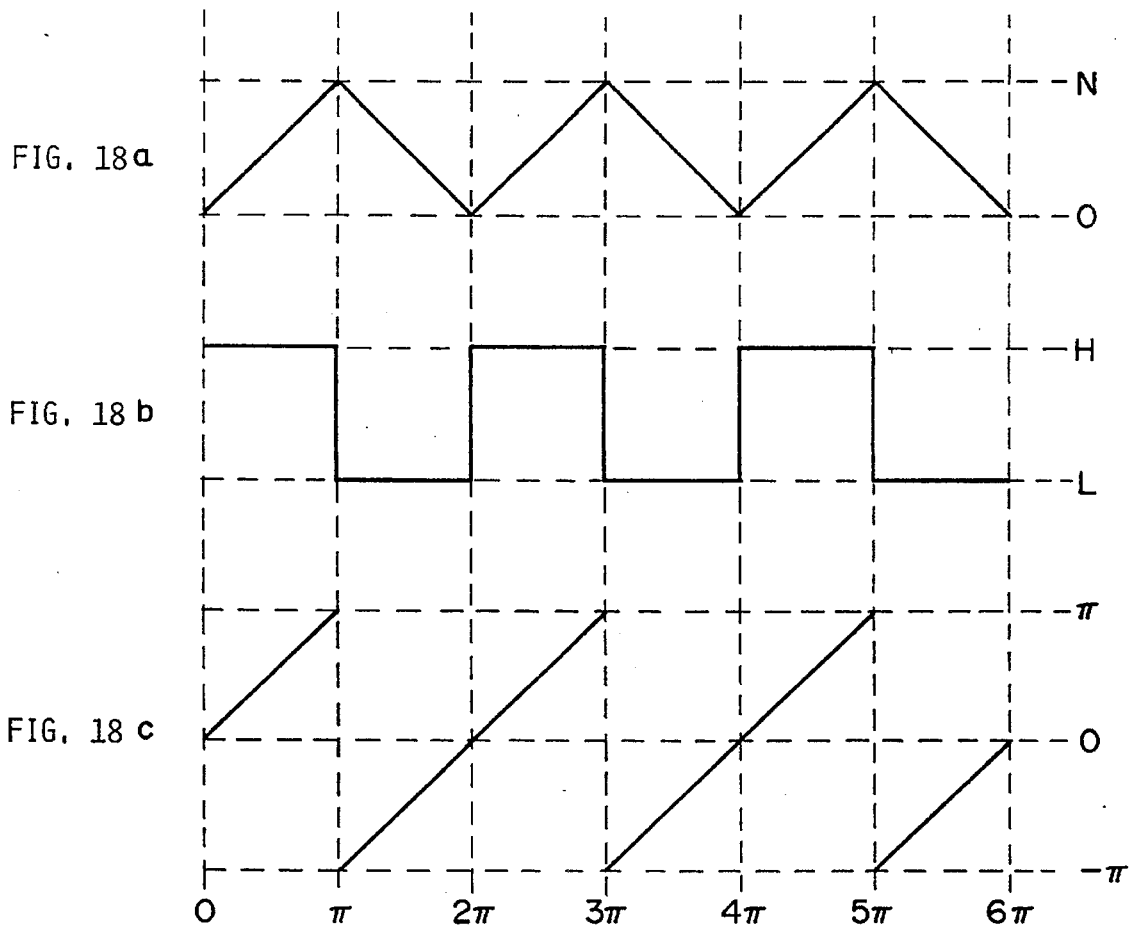
FIGS. 18a, 18b and 18c comprise diagrams showing the phase detection characteristic resulting from the processing by an EX-OR circuit and an LPF, the phase detection characteristic of a DFF circuit, and a linear phase detection characteristic respectively.

The phase difference discriminating circuit 93, as described above, is identical in operation with the phase difference discriminating circuit 93 described above in the second example of the clock recovery signal generating circuit of the present invention. Now, the operation of the phase difference discriminating circuit 93 will be explained below with reference to FIG. 15. To the phase difference discriminating circuit 93 are applied the clock recovery pulse S707 issued from the timing control circuit 707 and the clock signal S91 issued from the DPLL circuit 91. To the phase difference discriminating circuit 93 are applied the present clock signal (shown in FIG. 15a), the clock signal delayed by π/4 from the present clock signal (shown in FIG. 15b), the clock signal advanced by π/4 from the present clock (shown in FIG. 15c), and the clock recovery pulse S707 issued from the timing control circuit 707 (shown in FIG. 15d). Here, the phase difference discriminating circuit 93 discriminates the state of the clock recovery pulse S707 admitted therein and the state of the present clock signal based on the combination of the three clock signals admitted therein (shown in FIG. 15a, FIG. 15b, and FIG. 15c) (the states (1), (2), (3), (4), (5), (6), (7), and (8) shown in the diagrams). The state (1) represents the case in which the present clock signal assumes the state of L, the clock signal delayed by π/4 the state H, and the clock signal advanced by π/4 the state of L. In terms of the combination of the present clock signal, the clock signal delayed by π/4, and the clock signal advanced by π/4 as arranged in the order mentioned, the state (2) represents H·H·L, the state (3) H·H·H, the state (4) H·L·H, the state (5) L·L·H, the state (6) L·L·L, the state (7) L·H·L, and the state (8) H·H·L. In this case, the phase difference discriminating circuit 93 recognizes the clock recovery pulse S707 in the state (2). Based on the result of this recognition, the phase difference discriminating circuit 93 concludes that the clock signal S91 has been applied in a desirable phase angle (within π/4, for example). Then, the phase difference discriminating circuit 93 emits the phase difference discriminating signal S93 designating the low-speed control mode as an output to the gate circuit 1201 and the DPLL circuit 91. Here, the phase difference discrimination is effected by the use of the signal delayed by π/4 and the signal advanced by π/4 from the present clock signal. The difference does not need to be limited to π/4. The same effect is obtained by using a difference of π/2, for example.

To the gate circuit 1201 are applied the timing adjusting signal S1112 generated from the discriminating circuit 1112 and the phase difference discriminating signal S93 generated from the phase difference discriminating circuit 93. The phase difference discriminating signal S93 to be injected is used in two kinds, the one designating the high-speed control mode and the other the low-speed control mode. When the phase difference discriminating signal S93 to be applied designates the high-speed control mode, the gate circuit 1201 generates the timing adjusting signal S1201 as an output to the timing control circuit 707. When the phase difference discriminating signal S93 designates the low-speed control mode, the gate circuit 1201 does not generate the timing adjusting signal S1201 to the timing control circuit 707.

The clock recovery signal is generated in consequence of the operation described above.

The clock recovery signal generating circuit 71D of this invention generates the clock recovery pulse S707 by detecting the phase in the phase difference signal 6 by utilizing the cross phase relative to the plurality of detection levels (detection axes). The clock recovery signal generating circuit 71D of this invention, therefore, can quickly and correctly synchronize the clock signal S91 with the phase of the input signal during the period of preamble and, at the same time, can generate the clock recovery pulse S707 with a high probability even after the termination of the period of preamble. Then,.the clock recovery signal generating circuit 71D of this invention can continue to follow the clock recovery pulse S707 and can markedly reduce the possibility of disrupting synchronism as compared with the conventional clock recovery signal generating circuit. Further, the clock recovery signal generating circuit 71D of this invention, after having the clock signal S91 led into the phase of the input signal, controls the phase at a low speed. Even when the pulse happens to entrain such an extraneous signal as noise, therefore, the phase of the clock signal S91 is obtained stably irrespectively of the noise.

The fourth example can meet the contradictory demands, i.e. quick entrance of clock and stable regeneration of clock, more satisfactorily than the third example.

The examples cited above represent cases of using two or four detection levels (detection axes) for the estimation of loci of a phase difference signal. The present invention does not limit the number of detection levels to two or four. Three or five or more detection levels may be used when necessary. In this case, the number of sorts of locus (kinds of control of the timing control circuit) may be suitably selected in conformity with the number of detection levels to be adopted.

The examples cited above also represent cases of resorting to the precondition that the pattern of the period of preamble should be repetitions of "1001." This invention allows Use of other preamble patterns. In this case, the sorting of loci and the adjustment of output timing of the clock recovery pulses may be implemented in conformity with the particular preamble pattern to be adopted.

The clock recovery signal regenerating circuit of this invention finds extensive utility in differential demodulators for the π/4-shift QPSK signal. The digital mobile communication is not the only use to be found therefor.

This invention, as described above, constructs the clock recovery signal generating circuit with a plurality of detection axis cross detecting means varied in magnitude of detection axis and adapted to detect the time at which a phase difference signal crosses a detection axis of a fixed magnitude, locus sorting means for discriminating and sorting the locus of a change in the phase difference signal based on the detection timing obtained by the relevant detection axis cross detecting means and generating a timing adjusting signal in conformity with the result of the sorting as an output, and timing control means for obtaining a clock recovery phase signal by correcting the time detected by any of the detection axis cross detecting means designated by the timing adjusting signal with the time designated by the timing adjusting signal. This clock recovery signal generating circuit, therefore, is capable of ideally effecting the clock recovery during and after the admission of the clock signal.

INDUSTRIAL APPLICABILITY

The differential demodulators which incorporate therein the instantaneous phase detecting circuit or clock recovery signal generating circuit of the present invention are suitable for use in mobile communication systems which support such public services as police, flood control, road management, fire prevention, disaster prevention, radio communication among administrative agencies, electricity, gas, and water supply and mobile communication systems which promote such independent enterprises as taxicabs, railroads, newspapers, broadcasting systems, MCA land mobile radio communication system, automatic vehicle position indicating systems, home radio stations, specific small-power radio stations, personal radio stations, and amateur radio stations. They are also suitable for use in mobile communications systems for such land communication facilities as car telephones, cordless telephones, public train telephones, land mobile radio data communication systems, and airport mobile radio systems, such marine mobile communication facilities as ship telephones, marine satellite communication systems, and harbor wireless telephone and telegraph systems, and such aircraft mobile communication systems as public airplane telephones.

We claim:

1. An instantaneous phase detecting circuit for detecting the phase of a digital phase modulation wave signal comprising:

a first logic circuit receiving the modulation wave signal and a first carrier signal, said first logic circuit performing a logical operation using said modulation wave signal and said first carrier signal to generate a first arithmetic output;

a second logic circuit receiving the modulation wave signal and a second carrier signal, the phase of said second carrier signal being delayed by a fixed period with respect to the phase of said first carrier signal, said second logic circuit performing a logical operation using said modulation wave signal and said second carrier signal to generate a second arithmetic output;

a first phase detecting circuit receiving said first arithmetic output and said first carrier signal, said first phase detecting circuit detecting the phase of said first arithmetic output and generating a first detection output signal;

a second phase detecting circuit receiving said second arithmetic output and said first carrier signal, said second phase detecting circuit detecting the phase of said second arithmetic output and generating a second detection output signal; and a third logic circuit receiving said first and second detection output signals, said third logic circuit comparing a periodic deviation of said first and second detection output signals thereby detecting the phase of the modulation wave signal.

2. An instantaneous phase detecting circuit according to claim 1, wherein said second carrier signal is delayed in phase with respect to the phase of said modulation wave signal by π/2.

3. An instantaneous phase detecting circuit according to claim 1, wherein at least one of the first and second phase detecting circuits comprises:

a shift register receiving an arithmetic output from one of said first and second logic circuits for shifting said arithmetic output in accordance with the timing of said first carrier signal, said shift register generating the contents thereof written in the most significant bit and the least significant bit as a shift register output;

a comparator receiving said shift register output and said first carrier signal for comparing said shift register output in accordance with the timing of said first carrier signal, said comparator generating a comparator output; and an up-down counter receiving said comparator output for counting in accordance with said comparator output, said up-down counter generating one of said first and second detection output signals.

4. An instantaneous phase detecting circuit according to claim 1, wherein each of said first and second phase detecting circuits comprises:

a shift register receiving an arithmetic output from one of said first and second logic circuits for shifting said arithmetic output in accordance with the timing of said first carrier signal, said shift register generating the contents thereof written in the most significant bit and the least significant bit as a shift register output;

a comparator receiving said shift register output and said first carrier signal for comparing said shift register output in accordance with the timing of said first carrier signal, said comparator generating a comparator output; and an up-down counter receiving said comparator output for counting in accordance with said comparator output, said up-down counter generating one of said first and second detection output signals.

5. An instantaneous phase detecting circuit according to claim 2, wherein each of said first and second phase detecting circuits comprises:

a shift register receiving an arithmetic output from one of said first and second logic circuits for shifting said arithmetic output in accordance with the timing of said first carrier signal, said shift register generating the contents thereof written in the most significant bit and the least significant bit as a shift register output;

a comparator receiving said shift register output and said first carrier signal for comparing said shift register output in accordance with the timing of said first carrier signal, said comparator generating a comparator output; and an up-down counter receiving said comparator output for counting in accordance with said comparator output, said up-down counter generating one of said first and second detection output signals.

* * * * *